(12) United States Patent
Chen et al.

(10) Patent No.: US 11,284,045 B2
(45) Date of Patent: Mar. 22, 2022

(54) IMAGE SENSOR WITH SHIFTED COLOR FILTER ARRAY PATTERN AND BIT LINE PAIRS

(71) Applicant: OMNIVISION TECHNOLOGIES, INC., Santa Clara, CA (US)

(72) Inventors: Qingfei Chen, Santa Clara, CA (US); Rui Wang, San Jose, CA (US); Wei Wei Wang, Sunnyvale, CA (US); Zhiyong Zhan, Fremont, CA (US); Xin Wang, San Jose, CA (US); Qingwei Shan, San Jose, CA (US); Kenny Geng, Mountain View, CA (US)

(73) Assignee: OmniVision Technologies. Inc., Santa Clara, CA (US)

( * ) Notice: Subject to any disclaimer, the term of this patent is extended or adjusted under 35 U.S.C. 154(b) by 0 days.

(21) Appl. No.: 16/855,857

(22) Filed: Apr. 22, 2020

(65) Prior Publication Data
US 2021/0337169 A1  Oct. 28, 2021

(51) Int. Cl.
*H04N 5/374* (2011.01)
*H04N 9/04* (2006.01)
*H04N 5/369* (2011.01)
*H04N 5/378* (2011.01)
*H04N 5/3745* (2011.01)
*H01L 27/146* (2006.01)

(52) U.S. Cl.
CPC ....... *H04N 9/0455* (2018.08); *H04N 5/36961* (2018.08); *H04N 5/378* (2013.01); *H04N 5/3745* (2013.01); *H01L 27/14621* (2013.01); *H01L 27/14645* (2013.01)

(58) Field of Classification Search
None
See application file for complete search history.

(56) References Cited

U.S. PATENT DOCUMENTS

| | | | | |
|---|---|---|---|---|
| 10,334,189 | B1 * | 6/2019 | Xu | H04N 5/378 |
| 2011/0273597 | A1 * | 11/2011 | Ishiwata | H04N 5/347 348/272 |
| 2016/0205335 | A1 * | 7/2016 | Hiwada | H04N 5/3742 348/308 |
| 2017/0110503 | A1 * | 4/2017 | Kato | H01L 27/14645 |
| 2017/0163920 | A1 * | 6/2017 | Hwang | H04N 9/04557 |

(Continued)

*Primary Examiner* — Twyler L Haskins
*Assistant Examiner* — Wesley J Chiu
(74) *Attorney, Agent, or Firm* — Perkins Coie LLP

(57) ABSTRACT

An imaging device includes groupings of photodiodes having four photodiodes. A transfer transistor is between each photodiode and a floating diffusion. Each floating diffusion is coupled to up to two photodiodes per grouping at a time through transfer transistors. A buffer transistor is coupled to each floating diffusion. The buffer transistors may be in a first or second grouping of buffer transistors. A first bit line is coupled to up to two buffer transistors of the first grouping and a second bit line is coupled to up to two buffer transistors of the second grouping of buffer transistors at a time. A color filter array including a plurality of groupings of color filters is disposed over respective photodiodes of the photodiode array, wherein each grouping of color filters includes four color filters having a same color, wherein each grouping of color filters overlaps two groupings of photodiodes.

23 Claims, 14 Drawing Sheets

(56) References Cited

U.S. PATENT DOCUMENTS

| | | | |
|---|---|---|---|
| 2018/0027192 A1* | 1/2018 | Morisaki | H04N 5/37455 |
| | | | 348/308 |
| 2018/0332276 A1* | 11/2018 | Hayashi | H04N 5/3745 |
| 2020/0119066 A1* | 4/2020 | Yun | H01L 27/14641 |
| 2020/0314364 A1* | 10/2020 | Kim | H04N 9/04511 |
| 2021/0067726 A1* | 3/2021 | Ashitani | H01L 27/14603 |
| 2021/0104562 A1* | 4/2021 | Nakanishi | H04N 5/232 |
| 2021/0175269 A1* | 6/2021 | Fujita | H01L 27/14603 |
| 2021/0227164 A1* | 7/2021 | Ogura | H04N 5/37455 |

* cited by examiner

IMAGE SENSOR WITH SHIFTED COLOR FILTER ARRAY PATTERN AND BIT LINE PAIRS

BACKGROUND INFORMATION

Field of the Disclosure

This disclosure relates generally to image sensors, and in particular but not exclusively, relates to image sensors that include color filter arrays.

Background

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output signal from each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
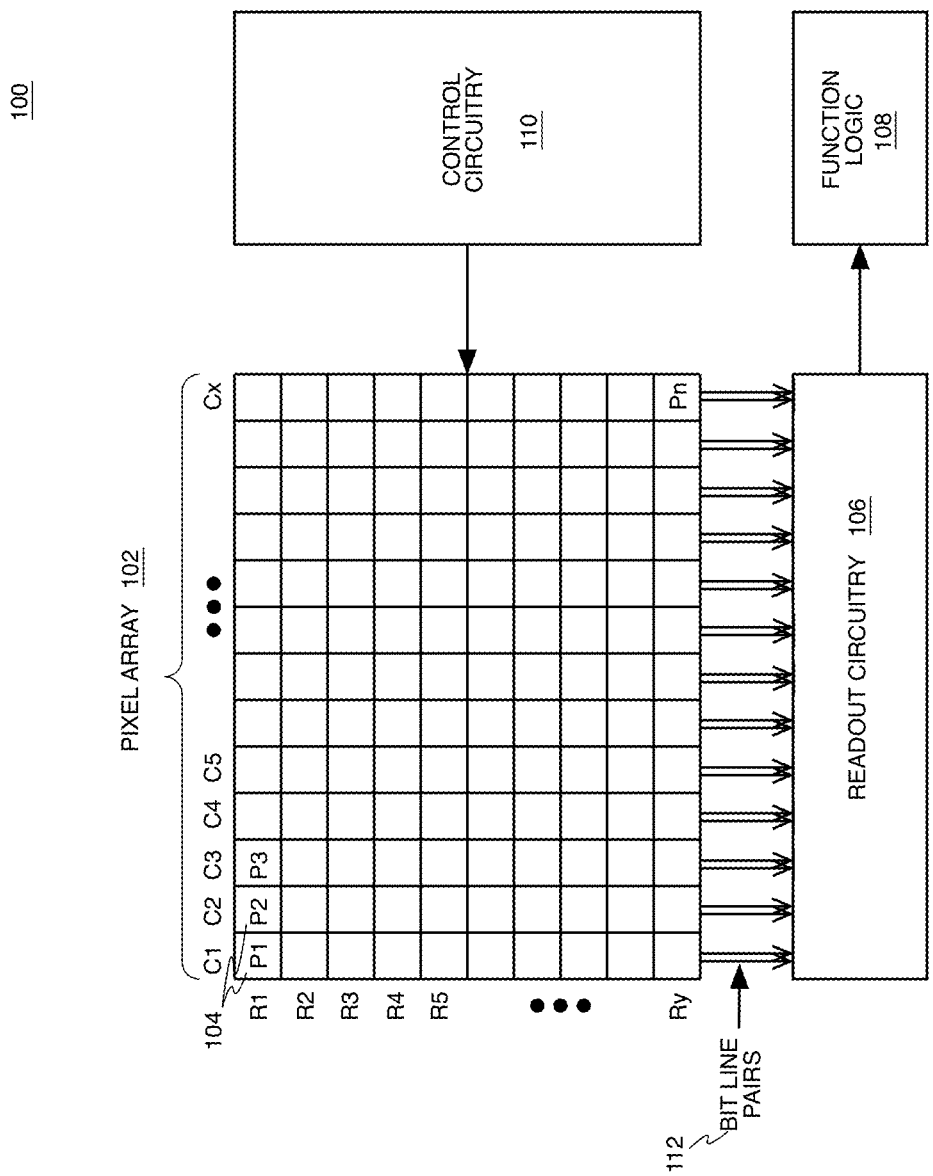
FIG. 1A illustrates one example of an imaging system including an image sensor with a shifted color filter array pattern and bit line pairs in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to reading out groupings of photodiodes included in imaging systems with a shifted color filter array pattern and bit line pairs are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of reading out color pixel arrays with groupings of photodiodes included in an imaging system with shifted color filter array patterns and bit line pairs are disclosed. In the various examples, the photodiodes in a color pixel array are organized into groupings of a plurality of photodiodes (e.g., four photodiodes) that are coupled to each floating diffusion. In various examples, the color filter array pattern of a color filter array that is disposed over the photodiodes is vertically shifted such that two different colors of the color filter array overlap each grouping of photodiodes. In one example, phase detection autofocus lenses may be interspersed among some of the color filters over PDAF configured photodiodes in the imaging system. The shifted color filter array pattern enables four neighboring photodiodes of the same color (which may sometimes be referred to as a 4C cell) to be read out with two floating diffusions instead of one using a pair of bit lines, which achieves high full well capacity (FWC) as well as increased read out speed in accordance with the teachings of the present invention.

To illustrate, FIG. 1A illustrates one example of an imaging system 100 including a color pixel array 102 with an array of photodiodes organized into groupings of photodiodes that are included in pixels 104 in accordance with an embodiment of the present disclosure. As will be discussed in greater detail below, a shifted color filter array pattern is disposed over the array of photodiodes and each column of groupings of photodiodes may be read out through bit line pairs 112. As shown, imaging system 100 includes pixel array 102, control circuitry 110, readout circuitry 106, and function logic 108. In one example, pixel array 102 is a two-dimensional (2D) array including a plurality of photodiodes, (e.g., P1, P2, . . . , Pn). In one example, some of the photodiodes that are interspersed among the array of photodiodes are configured as phase detection autofocus (PDAF) photodiodes, which are interspersed among regular image sensing photodiodes in the pixel array 102. As illustrated in the depicted example, pixels 104 are arranged into rows (e.g., R1 to Ry) and columns (e.g., C1 to Cx) to acquire image data of a person, place, object, etc., which can then be used to render a 2D image of the person, place, object, etc. In the examples, the phase detection autofocus photodiodes interspersed in the pixel array 102 provide phase detection information, which can be used for autofocus operations of imaging system 100.

In one example, after each image sensor photodiode in pixel array 102 has acquired its image charge or phase detection charge through photogeneration of the charge in response to incident light, corresponding image data and/or phase detection charge is read out by a readout circuitry 106 through bit line pairs 112 and then transferred to function logic 106 in accordance with teachings of the present invention. Readout circuitry 106 may be coupled to read out data from the pixels 104 in pixel array 102. In various examples, the readout circuitry 106 may include amplification circuitry, analog-to-digital (ADC) conversion circuitry, or otherwise. In one example, the readout circuitry 106 may read out image data or phase detection data from pixels 104 through bit line pairs 112 as illustrated in FIG. 1A. The function logic 108 may store the image data or even manipulate the image data by applying post image effects (e.g., crop, rotate, remove red eye, adjust brightness, adjust contrast, or otherwise).

Figure 1B:
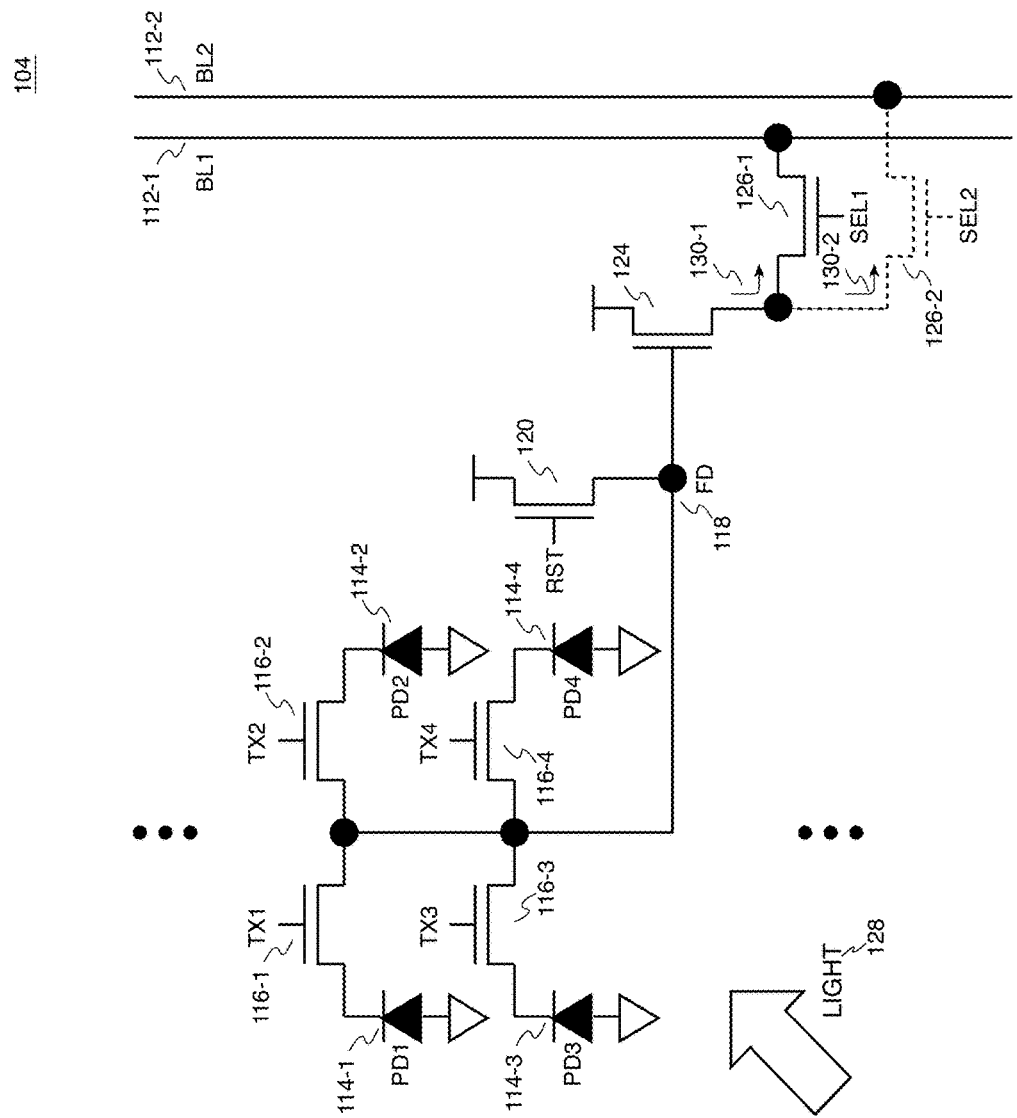
FIG. 1B illustrates one example of a pixel circuit with a grouping of photodiodes included in an imaging system with a shifted color filter array pattern and bit line pairs in accordance with the teachings of the present invention.

FIG. 1B illustrates one example of a schematic of a pixel circuit 104, which is included in an image sensor with a shifted color filter array pattern and bit line pairs in accordance with the teachings of the present invention. It is appreciated the pixel circuit 104 of FIG. 1B may be one example of a pixel 104 of the image sensor 100 as shown in FIG. 1A, and that similarly named and numbered elements described above are coupled and function similarly below.

In the example depicted in FIG. 1B, pixel circuit 104 is one of a plurality of pixel circuits 104 included in a pixel array 102. Pixel circuit 104 includes a grouping of a plurality of photodiodes, which in the depicted example is four neighboring photodiodes 114-1, 114-2, 114-3, and 114-4. Each photodiode 114-1, 114-2, 114-3, and 114-4 is coupled to photogenerate charge in response to incident light 128. As will be discussed, in various examples, incident light 128 is directed through a color filter with a shifted color filter array pattern, or a phase detection autofocus lens, in accordance with the teachings of the present invention. As such, in various examples, two of the four photodiodes 114-1, 114-2, 114-3, and 114-4 are configured to receive incident light 128 through a color filter having one color, while the other two of the four photodiodes 114-1, 114-2, 114-3, and 114-4 are configured to receive light through a color filter having a different color. In one example, two of the four photodiodes 114-1, 114-2, 114-3, and 114-4 are configured to receive incident light 128 through a color filter having one color, while the other two of the four photodiodes 114-1, 114-2, 114-3, and 114-4 are configured to receive light through a phase detection autofocus (PDAF) lens disposed over 2×2 PDAF photodiodes or lenses that are interspersed among the color filters of the color filter array.

The example depicted in FIG. 1B also illustrates that a grouping of transfer transistors is coupled to the grouping of photodiodes. In the example, the grouping of transfer transistors includes transfer transistors 116-1, 116-2, 116-3, and 116-4, which are coupled to be controlled in response to transfer transistor control signals TX1, TX2, TX3, and TX4, respectively. As shown, each of the four transfer transistors 116-1, 116-2, 116-3, and 116-4 is coupled to between a respective one of the four photodiodes 114-1, 114-2, 114-3, and 114-4 and a floating diffusion 118. As will be discussed, up to two of the four transfer transistors 116-1, 116-2, 116-3, and 116-4 are coupled to be selectively turned on at a time in response to transfer transistor control signals TX1, TX2, TX3, and TX4. For instance, in one example, at a time in which transfer transistors 116-1 and 116-2 are selectively turned on to read out image charge information from photodiodes 114-1 and 114-2, respectively, transfer transistors 116-3 and 116-4 are turned off. Similarly, at a time in which transfer transistors 116-3 and 116-4 are selectively turned on to read out image charge information from photodiodes 114-3 and 114-4, respectively, transfer transistors 116-1 and 116-2 are turned off. In other examples, only one of the four transfer transistors 116-1, 116-2, 116-3, and 116-4 is selectively turned on, while the other three of the four transfer transistors 116-1, 116-2, 116-3, and 116-4 are turned off during a readout operation.

As shown in the illustrated example, the floating diffusion 118 is coupled to the grouping of transfer transistors, which includes transfer transistors 116-1, 116-2, 116-3, and 116-4.

As mentioned above, only up to two of the four transfer transistors 116-1, 116-2, 116-3, and 116-4 are selectively turned on at a time. As such, floating diffusion 118 is coupled to receive image charge from the respective up to two of the four photodiodes 114-1, 114-2, 114-3, and 114-4 through the respective up to two of the four transfer transistors 116-1, 116-2, 116-3, and 116-4 that are selectively turned on at the time.

The example shown in FIG. 1B shows that a reset transistor 120 and a buffer transistor 124 are coupled a voltage supply and to floating diffusion 118. In operation, the reset transistor is coupled to reset the floating diffusion 118 in response to a reset signal RST. In the example, the buffer transistor has a gate terminal that is coupled to the floating diffusion 118 to generate an output signal 130 in response to the charge that has been transferred to floating diffusion 118 from the respective photodiodes 114 through the respective transfer transistors 116.

The depicted example also shows a bit line pair 112, which includes a first bit line BL1 112-1 and a second bit line BL2 112-2. As discussed above, pixel circuit 104 is one of a plurality of pixel circuits 104 in the pixel array 102. As such, buffer transistor 124 is one of a plurality of buffer circuits 124 included in the pixel array 102. In one example, the buffer transistors 124 that are selectively coupled to the first bit line BL1 112-1 through a select transistor 126-1 in response to a select signal SEL1 are considered to be included in a first grouping of buffer transistors. In the example, the buffer transistors 124 that are selectively coupled to the second bit line BL2 112-2 through a select transistor 126-2 in response to a select signal SEL2 are considered to be included in a second grouping of buffer transistors. In various examples, pixel circuit 104 may include one or both of select transistor 126-1 and select transistor 126-2 depending on the desired configuration. In a configuration in which both select transistor 126-1 and select transistor 126-2 are included, buffer transistor 124 may be considered to be in a third grouping of buffer transistors.

In operation, the output signal generated by buffer transistor 124 is selectively coupled to be received by the first bit line BL1 112-1 as output signal 130-1 through select transistor 126-1. Similarly, the output signal 130 generated by buffer transistor 124 is selectively coupled to be received by the second bit line BL2 112-2 as output signal 130-2 through select transistor 126-2. In one example, the output signal 130 generated by buffer transistor 124 may comprise a current, which is received by the respective bit line 112. As such, a total output signal through a respective bit line 112 at a particular time is the sum or combined total of all of the currents received from each respective pixel circuit 104 that is coupled to the bit line 112 at that time.

Figure 2A:
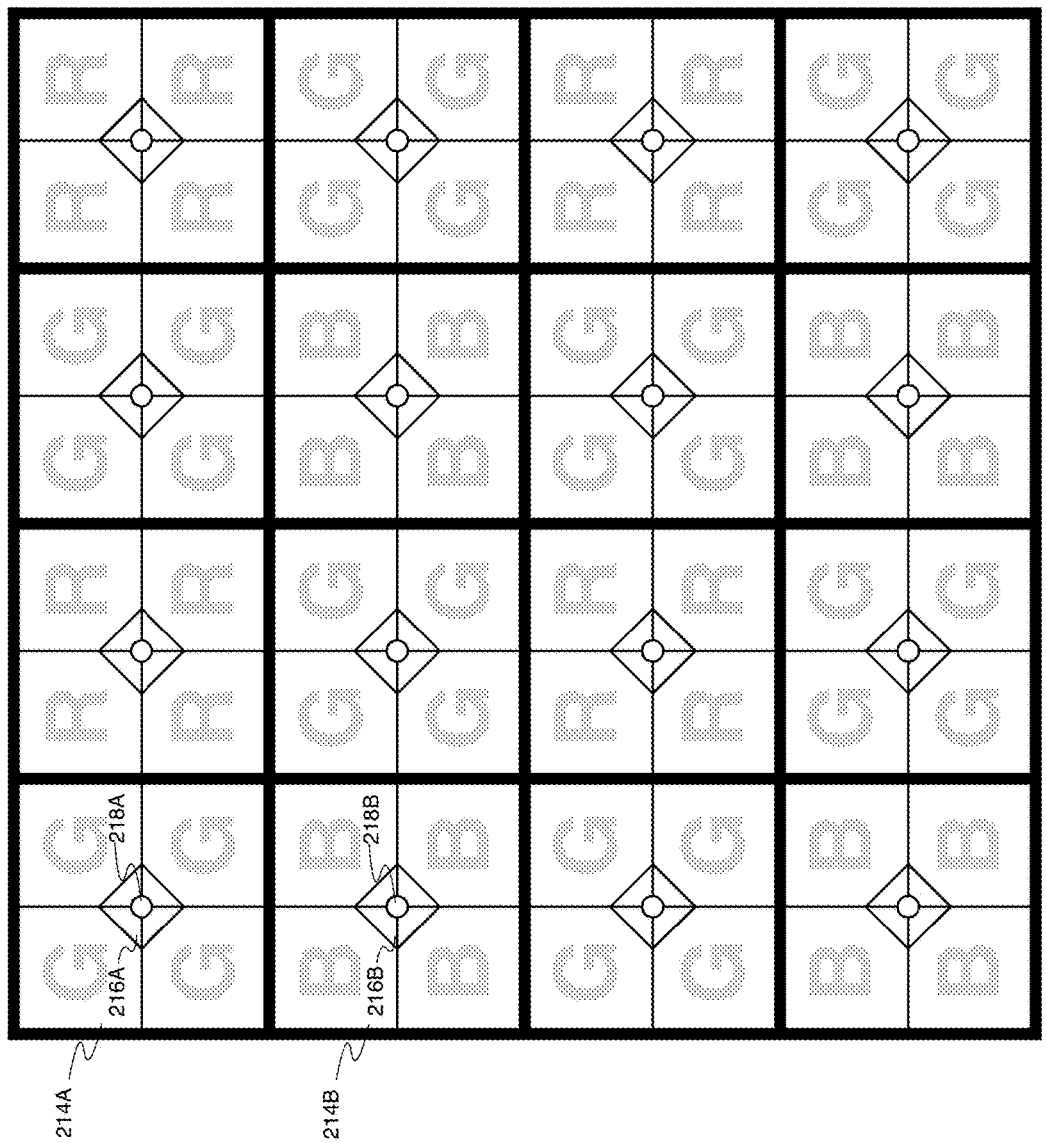
FIG. 2A illustrates an example of a color pixel array with groupings of photodiodes of the same color that are accessed with one floating diffusion.

FIG. 2A illustrates an example of a color pixel array 202A including a color filter array disposed over groupings of photodiodes 214A, 214B. In the example, each grouping of photodiodes 214A, 214B includes four neighboring photodiodes surrounding four respective transfer transistors 216A, 216B, which surround respective floating diffusions 218A, 218B. Thus, as shown in the depicted example, each single floating diffusion 218A, 218B is shared among the four respective photodiodes included in each respective grouping of photodiodes 214A, 214B through respective transfer transistors 216A, 216B. In the example, the color filter array has a Bayer color filter array pattern. In the depicted example, red color filters are indicated with an "R" label, green color filters are indicated with a "G" label, and blue color filters are indicated with a "B" label. As shown in the example depicted in FIG. 2A, all four photodiodes of each grouping of photodiodes 214A, 214B are under the same color filter of the color filter array.

In various configurations, a 4C-1 floating diffusion (FD) summing mode transfers charges of all four photodiodes of each color (red, green, or blue) of the grouping of photodiodes 214A, 214B to the respective shared floating diffusion 218A, 218B through the respective transfer transistors 216A, 216B. One of the challenges with 4C-1 FD summing mode transfers is that normally, the signal from all four photodiodes is too high to be transferred to a single floating diffusion, or the signal from all four photodiodes is too high to be handled by the circuitry. A solution would have to trade off a low photodiode full well capacity or low conversion gain.

In another configuration, 4C-2 binning mode transfers charges of only two of the four photodiodes of each color (red, green, or blue) of the grouping of photodiodes 214A, 214B to the shared floating diffusion 218A, 218B at a time. Thus, the output signal values would need to be read out separately in time, stored, and then at a later time be summed together in order determine the total signal from the four photodiodes of the same color. As a consequence, image sensor speed would be slowed down significantly because each grouping of photodiodes 214A, 214B, needs to be read out twice to determine the total signal from all four photodiodes of the same color.

Figure 2B:
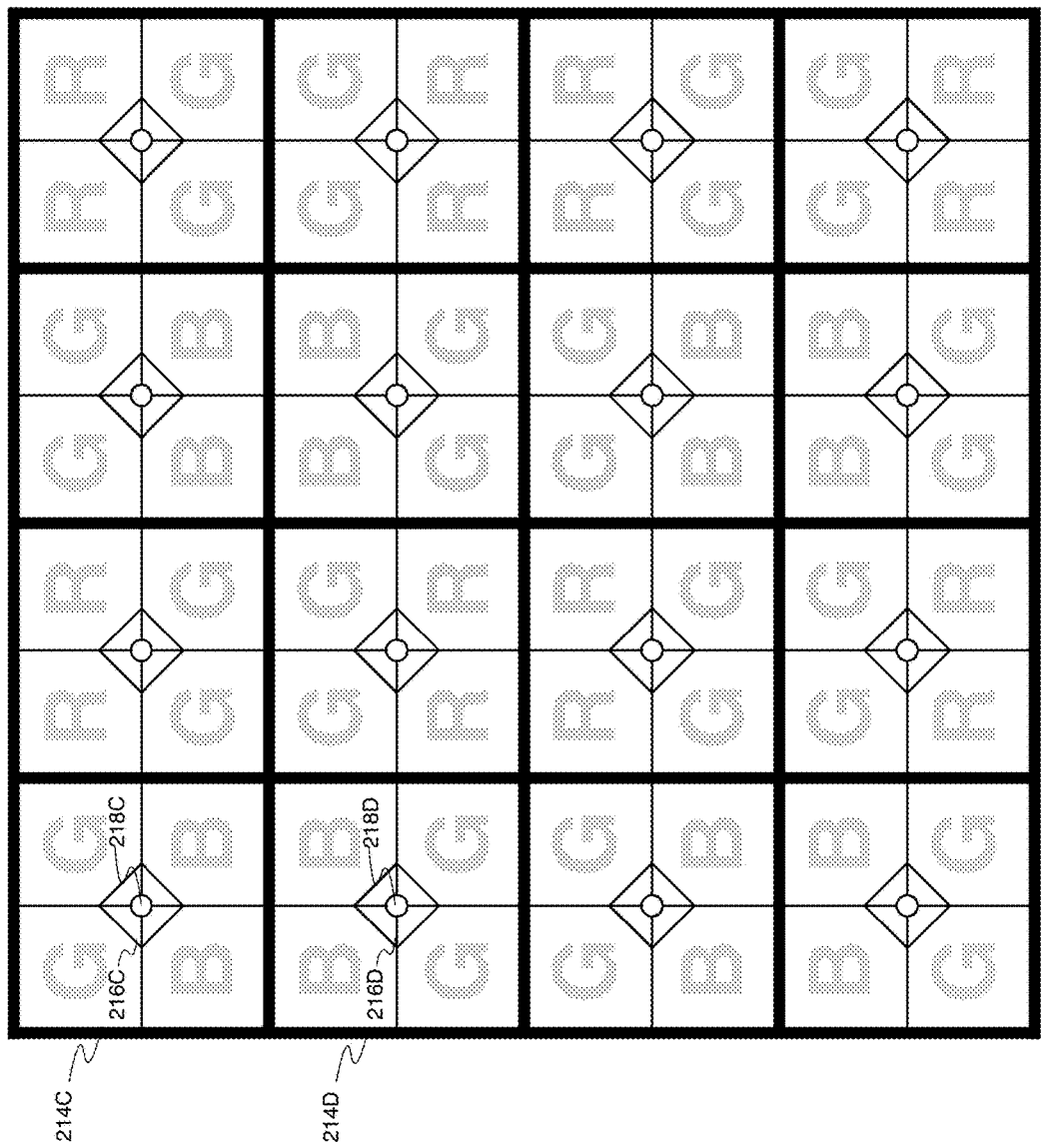
FIG. 2B illustrates an example of a color pixel array with groupings of photodiodes of the that are overlapped by two color filters of a shifted color filter array pattern and accessed by two floating diffusions in accordance with the teachings of the present invention.

FIG. 2B illustrates an example of a color pixel array 202B with a color filter array disposed over groupings of photodiodes 214C, 214D. In the example, each grouping of photodiodes 214C, 214D includes four neighboring photodiodes surrounding four respective transfer transistors 216C, 216D, which surround respective floating diffusions 218C, 218D. Thus, as shown in the depicted example, each single floating diffusion 218C, 218D is shared among the four respective photodiodes included in each respective grouping of photodiodes 214C, 214D through transfer transistors 216C, 216D. In the example, the color filter array has a Bayer color filter array pattern with red color filters indicated with an "R" label, green color filters are indicated with a "G" label, and blue color filters are indicated with a "B" label.

One difference between the color pixel array 202B of FIG. 2B and color pixel array 202A of FIG. 2A is that the color filter array in color pixel array 202B of FIG. 2B is shifted in the vertical direction of FIG. 2B in by one photodiode (e.g., 1C), or by half of a grouping of photodiodes relative to the color filter array in FIG. 2A. As such, each grouping of four color filters having a same color (e.g., each grouping of four red "R" color filters, each grouping of four green "G" color filters, or each grouping of four blue "B" color filters) overlaps two 2×2 groupings of photodiodes 214C, 214D below.

For instance, the example color pixel array 202B depicted in FIG. 2B shows that in the left most column of groupings of photodiodes, the top two photodiodes of the grouping of photodiodes 214C is overlapped by green "G" color filters and the bottom two photodiodes of the grouping of photodiodes 214C is overlapped by blue "B" color filters. Similarly, the top two photodiodes of the grouping of photodiodes 214D is overlapped by blue "B" color filters and the bottom two photodiodes of the grouping of photodiodes 214D is overlapped by green "G" color filters, and so on. In other words, two groupings of photodiodes are overlapped by each grouping of the color filters that have the same color in accordance with the teachings of the present invention.

As will be discussed in greater detail below, by shifting the color filter array as shown for example in FIG. 2B, the 2×2 groupings of four neighboring photodiodes that are all exposed to the same color light (e.g., four photodiodes exposed to red "R" light, four photodiodes exposed to green "G" light, or four photodiodes exposed to blue "B" light) are accessed via two floating diffusions 218C, 218D instead of one floating diffusion in accordance with the teachings of the present invention. In so doing, the shifted color filter array pattern enables four neighboring photodiodes of the same color to be read out at the same time with two floating diffusions instead of one, which achieves a high full well capacity (FWC) with the two floating diffusions as well as increased read out speed since only one read period is needed to read all four neighboring photodiodes in accordance with the teachings of the present invention.

Figure 3:
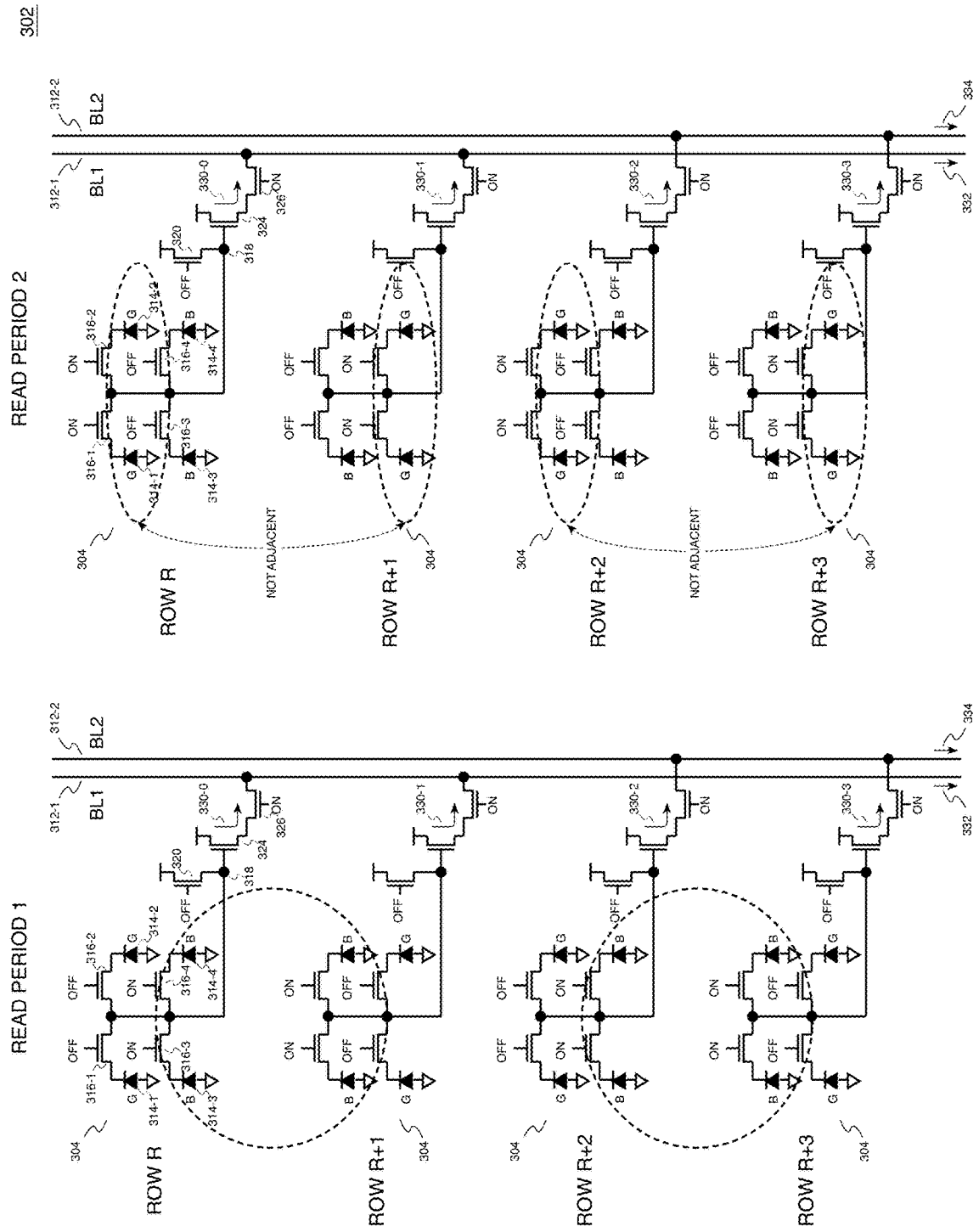
FIG. 3 shows one example of a read out of an example schematic of a column of groupings of photodiodes included in an imaging system with a shifted color filter array pattern and bit line pairs in accordance with the teachings of the present invention.

To illustrate, FIG. 3 shows a read out of one example schematic of a column of groupings of photodiodes included in a color pixel array 302 of an imaging system with a shifted color filter array pattern and bit line pairs in accordance with the teachings of the present invention. It is appreciated the color pixel array 302 of FIG. 3 may be an example of a pixel circuitry included in the of the color pixel array 202B discussed in FIG. 2B or the pixel array 102 as discussed in FIGS. 1A-1B, and that similarly named and numbered elements described above are coupled and function similarly below.

In the example shown in FIG. 3, a column of pixels circuits 304 is shown. As can be appreciated, each pixel circuit 304 shown in FIG. 3 is another example of pixel circuit 104 described in FIG. 1B. Thus, similarly named and numbered elements described above in FIG. 1B are coupled and function similarly in FIG. 3. In addition, the column of pixel circuits 304 may be a schematic example of the left most column of color pixel array 202B shown in FIG. 2B, which includes a repeating pattern of green, blue, green, blue, and green color filters down the column from top to bottom. As shown, in FIG. 3, each pixel circuit 304 includes a 2×2 grouping of four photodiodes 314. In the depicted example, the pixel circuit 304 in the top row R of color pixel array 302 includes green "G" photodiodes 314-1, 314-2 on the top, and blue "B" photodiodes 314-3, 314-4 on the bottom. Similarly, the pixel circuits 304 of the following rows R+1, R+2, and R+3 include a repeating pattern from top to bottom of blue "B" and green "G", green "G" and blue "B", and blue "B" and green "G" photodiodes, and so on down the column.

In the example illustrated in FIG. 3, the photodiodes 314 that are under the blue "B" color filters are read out during READ PERIOD 1 as shown. The photodiodes 314 that are under the blue "B" color filters are labeled with a "B" and are inside the dashed oval lines under READ PERIOD 1 in FIG. 3. The transfer transistors 316 that are coupled to the photodiodes 314 that are under the blue "B" color filters are selectively turned ON as shown, and the transfer transistors 316 that are not coupled to the photodiodes 314 that are under the blue "B" color filters are selectively turned OFF as shown. Therefore, it is noted that only two out of the four transfer transistors 316 of each pixel circuit 304 are turned ON at a time in accordance with the teachings of the present invention. As such, each respective floating diffusion 318 in each pixel circuit 304 is selectively coupled to receive the image charge generated from only the two photodiodes 314 that are under a blue "B" color filter out of the four photodiodes 314 in each 2×2 grouping of photodiodes. Since only two out of the four transfer transistors 314 are turned ON, it is appreciated that the full well capacity of each floating diffusion 318 is not exceeded in accordance with the teachings of the present invention.

Each buffer transistor 324 of each pixel circuit 304 generates a respective output signal 330 in response to the image charge transferred to the respective floating diffusion 318 through the two respective transfer transistors 316 that are selectively turned ON. As shown in the example, a pair of bit lines 312 is coupled to each column of pixel circuits 304. In the depicted example, the buffer transistor 324 of the pixel circuits 304 of Rows R and R+1 are coupled through respective select transistors 326 to the first bit line BL1 312-1, and the buffer transistor 324 of the pixel circuits 304 of Rows R+2 and R+3 are coupled to the second bit line BL2 312-2. In one example, it is appreciated that the buffer transistors 324 in a column of pixel circuits 304 that are coupled through respective select transistors 326 to the first bit line BL1 312-1 may be considered as being in a first grouping of buffer transistors, and the buffer transistors 324 that are coupled through respective select transistors 326 to the second bit line BL2 312-2 may be considered as being in a second grouping of buffer transistors. In the depicted example, it is appreciated that the buffer transistors 324 of each respective pixel circuit 304 may be coupled to the pair of bit lines 312 from top to bottom in a repeating pattern of N buffer transistors 324 of the first grouping (e.g., Rows R and R+1) and N buffer transistors 324 of the second grouping (e.g., Rows R+2 and R+3) and so on down the column In the example shown in FIG. 3, N=2.

During READ PERIOD 1 as shown in FIG. 3, the output signal 330-0 from the pixel circuit 304 of Row R and the output signal 330-1 from the pixel circuit 304 of Row R+1 are both coupled to be received by the first bit line BL1 312-1. Similarly, the output signal 330-2 from the pixel circuit 304 of Row R+2 and the output signal 330-3 from the pixel circuit 304 of Row R+3 are both coupled to be received by the second bit line BL1 312-2. In the depicted example, each bit line 312 is coupled to receive only up to two output signals 330 from up to two buffer transistors 324 at a time. In one example, the output signal 330 generated by each buffer transistor 324 comprises a current. Therefore, the total output signal 332 is a sum of the currents received by first bit line BL1 312-1, and the total output signal 334 is a sum of the currents received by second bit line BL2 312-2.

Thus, in the example shown in FIG. 3, total output signal 332 of the first bit line BL1 312-1 is representative of the image charge photogenerated in the four photodiodes 314 that are under blue "B" color filters in Rows R and R+1 of the column. Similarly, total output signal 334 of the second bit line BL2 312-2 is representative of the image charge photogenerated in the four photodiodes 314 that are under blue "B" color filters in Rows R+2 and R+3 of the column. As can be appreciated, the image charge read out from each four photodiode grouping of blue "B" photodiodes is read out via two floating diffusions instead one floating diffusion in accordance with the teachings of the present invention.

Continuing the example shown in FIG. 3, the photodiodes 314 that are under green "G" color filters are read out during READ PERIOD 2 as shown. The photodiodes 314 that are under the green "G" color filters are labeled with a "G" and are inside the dashed oval lines under READ PERIOD 2 in FIG. 3. The transfer transistors 316 that are coupled to the photodiodes 314 that are under the green "G" color filters are selectively turned ON as shown, and the transfer transistors 316 that are not coupled to the photodiodes 314 that are under the green "G" color filters are selectively turned OFF as shown. Therefore, it is noted that only two out of the four transfer transistors 316 of each pixel circuit 304 is turned ON at a time in accordance with the teachings of the present invention. As such, each respective floating diffusion 318 in each pixel circuit 304 is selectively coupled to receive the image charge generated from only the two photodiodes 314 that are under a green "G" color filter out of the four photodiodes 314 in each 2×2 grouping of photodiodes. Since only two out of the four transfer transistors 314 are turned ON, it is appreciated that the full well capacity of each floating diffusion 318 is not exceeded in accordance with the teachings of the present invention.

Each buffer transistor 324 of each pixel circuit 304 generates a respective output signal 330 in response to the image charge transferred to the respective floating diffusion 318 through the two respective transfer transistors 316 that are selectively turned ON. Thus, in the example shown in FIG. 3 during READ PERIOD 2, total output signal 332 of the first bit line BL1 312-1 is representative of the image charge photogenerated in the four photodiodes 314 that are under green "G" color filters in Rows R and R+1 of the column. Similarly, total output signal 334 of the second bit line BL2 312-2 is representative of the image charge photogenerated in the four photodiodes 314 that are under green "G" color filters in Rows R+2 and R+3 of the column. As can be appreciated, the image charge read out from each four photodiode grouping of green "G" photodiodes is read out via two floating diffusions instead one floating diffusion in accordance with the teachings of the present invention.

Therefore, it is appreciated that with the example color pixel array 302 illustrated in FIG. 3, only two read periods are required to read two rows of 2×2 groupings of photodiodes (i.e., 4C cells). It is noted however in the depicted example of FIG. 3 that the respective green "G" photodiode pairs of Rows R/R+1 read out via first bit line BL1 312-1 and the green "G" photodiode pairs of Rows R+2/R+3 read out via second bit line BL2 312-2 are not adjacent photodiode pairs, which may result in less than ideal vertical resolution for the green channel. It is appreciated that the red channel in the next column to the right in the pixel array 302 would also suffer a similar degradation in vertical resolution since the red "R" photodiode pairs would also not be adjacent in Rows R/R+1 and Rows R+2/R+3.

Figure 4:
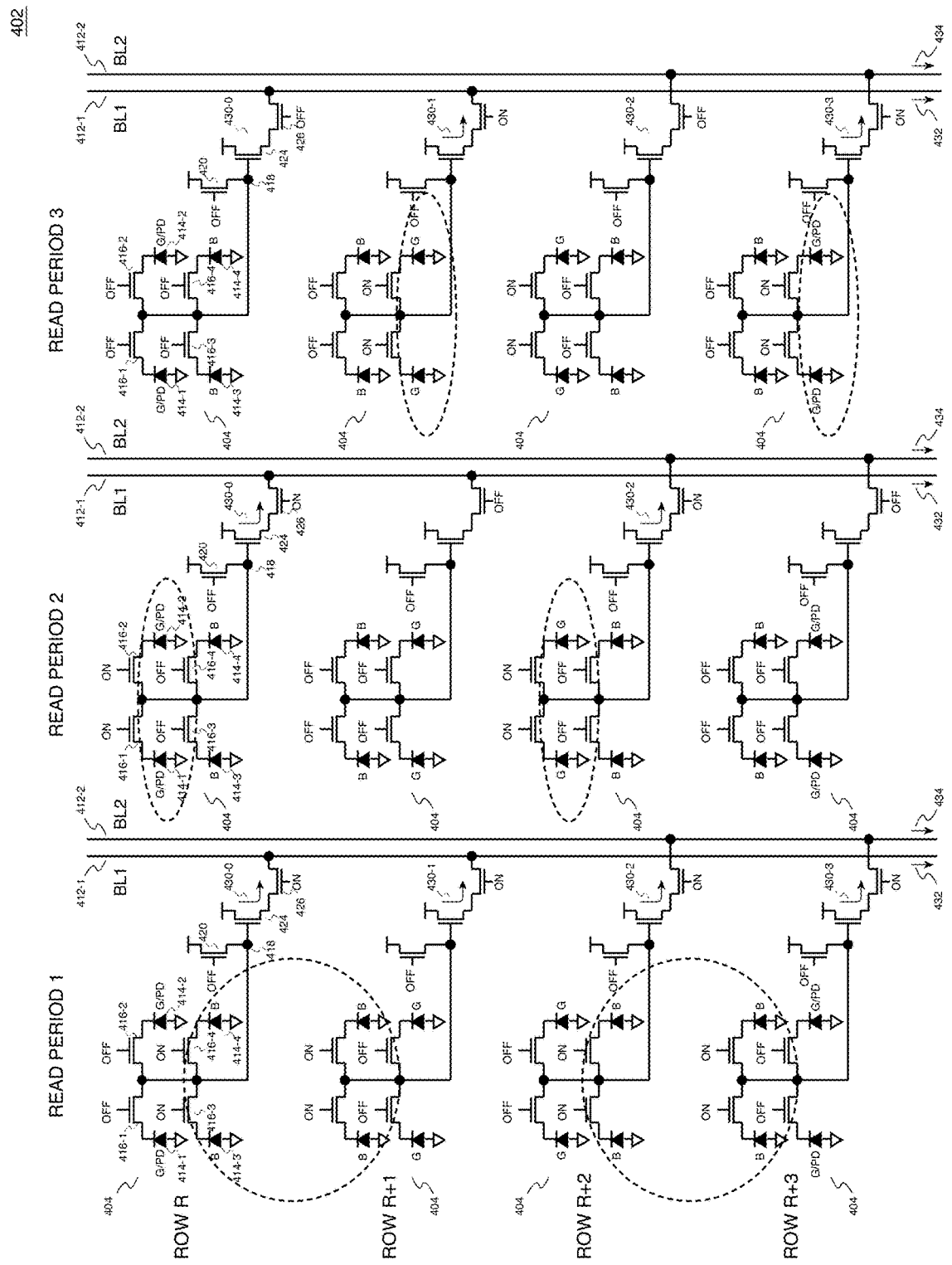
FIG. 4 shows one example of a read out of another example schematic of a column of groupings of photodiodes included in an imaging system with a shifted color filter array pattern and bit line pairs in accordance with the teachings of the present invention.

FIG. 4 shows one example of a read out of another example schematic of a column of groupings of photodiodes included in a color pixel array 402 of an imaging system with a shifted color filter array pattern and bit line pairs in accordance with the teachings of the present invention. It is appreciated the color pixel array 402 of FIG. 4 may be another example of a pixel circuitry included the examples discussed above in FIGS. 2B-3 or the pixel array 102 as discussed in FIGS. 1A-1B, and that similarly named and numbered elements described above are coupled and function similarly below.

In the example shown in FIG. 4, a column of pixels circuits 404 is shown. Similar to the example illustrated in FIG. 3, each pixel circuit 404 shown in FIG. 4 is another example of pixel circuit 104 described in FIG. 1B. Thus, similarly named and numbered elements described above in FIG. 1B are coupled and function similarly in FIG. 4. In addition, the column of pixel circuits 404 may be a schematic example of the left most column of color pixel array 202B shown in FIG. 2B, which includes a repeating pattern of green, blue, green, blue, and green color filters from top to bottom. As shown, in FIG. 4, each pixel circuit 404 includes a 2×2 grouping of four photodiodes 414. In the depicted example, the pixel circuit 404 in the top row R of color pixel array 402 includes green "G" photodiodes 414-1, 414-2 on the top, and blue "B" photodiodes 414-3, 414-4 on the bottom. Similarly, the pixel circuits 404 of the following rows R+1, R+2, and R+3 include a repeating pattern from top to bottom of blue "B" and green "G", green "G" and blue "B", and blue "B" and green "G" photodiodes.

In another example, it is appreciated that FIG. 4 also illustrates an example in which phase detection autofocus photodiodes (PDAF) may be interspersed in pixel circuits 404 in the color pixel array 402 to provide phase detection autofocus information to the imaging system. In the example depicted in FIG. 4, some of the groupings of green "G" photodiodes are therefore instead configured as PDAF photodiodes, which are labeled "PD" in FIG. 4. In particular, in the example illustrated in FIG. 4, the pixel circuit 404 in the top row R of color pixel array 402 may instead be PDAF photodiodes "PD" 414-1, 414-2 on the top, and blue "B" photodiodes 414-3, 414-4 on the bottom. Similarly, the row R+3 of pixel circuit 404 includes blue "B" photodiodes on the top, and PDAF photodiodes "PD" on the bottom instead. In the example, the pattern illustrated in FIG. 4 may continue along the column of pixel circuits. In one example, the PDAF photodiodes "PD" are disposed under respective PDAF lenses that are also interspersed throughout the color pixel array 402.

In the depicted example, the photodiodes 414 that are under the blue "B" color filters are read out during READ PERIOD 1 as shown. The photodiodes 414 that are under the blue "B" color filters are labeled with a "B" and are inside the dashed oval lines under READ PERIOD 1 in FIG. 4. The transfer transistors 416 that are coupled to the photodiodes 414 that are under the blue "B" color filters are selectively turned ON as shown, and the transfer transistors 416 that are not coupled to the photodiodes 414 that are under the blue "B" color filters are selectively turned OFF as shown. Therefore, it is noted that only two out of the four transfer transistors 416 of each pixel circuit 404 are turned ON at a time in accordance with the teachings of the present invention. As such, each respective floating diffusion 418 in each pixel circuit 404 is selectively coupled to receive the image charge generated from only the two photodiodes 414 that are under a blue "B" color filter out of the four photodiodes 414 in each 2×2 grouping of photodiodes. Since only two out of the four transfer transistors 414 are turned ON, it is appreciated that the full well capacity of each floating diffusion 418 is not exceeded in accordance with the teachings of the present invention.

Each buffer transistor 424 of each pixel circuit 404 generates a respective output signal 430 in response to the image charge transferred to the respective floating diffusion 418 through the two respective transfer transistors 416 that are selectively turned ON. As shown in the example, a pair of bit lines 412 is coupled to each column of pixel circuits 404. In the depicted example, the buffer transistor 424 of the pixel circuits 404 of Rows R and R+1 are coupled through respective select transistors 426 to the first bit line BL1 412-1, and the buffer transistor 424 of the pixel circuits 404 of Rows R+2 and R+3 are coupled to the second bit line BL2 412-2. In one example, it is appreciated that the buffer transistors 424 in a column of pixel circuits 404 that are coupled through respective select transistors 426 to the first bit line BL1 412-1 may be considered as being in a first grouping of buffer transistors, and the buffer transistors 424 that are coupled through respective select transistors 426 to the second bit line BL2 412-2 may be considered as being in a second grouping of buffer transistors. In the depicted example, it is appreciated that the buffer transistors 424 of each respective pixel circuit 404 may be coupled to the pair of bit lines 412 from top to bottom in a repeating pattern of N buffer transistors 424 of the first grouping (e.g., Rows R and R+1) and N buffer transistors 424 of the second grouping (e.g., Rows R+2 and R+3) and so on down the column. In the example shown in FIG. 4, N=2.

During READ PERIOD 1 as shown in FIG. 4, the output signal 430-0 from the pixel circuit 404 of Row R and the output signal 430-1 from the pixel circuit 404 of Row R+1 are both coupled to be received by the first bit line BL1 412-1. Similarly, the output signal 430-2 from the pixel circuit 404 of Row R+2 and the output signal 430-3 from the pixel circuit 404 of Row R+3 are both coupled to be received by the second bit line BL2 412-2. In the depicted example, each bit line 412 is coupled to receive only up to two output signals 430 from up to two buffer transistors 424 at a time. In one example, the output signal 430 generated by each buffer transistor 424 comprises a current. Therefore, the total output signal 432 is a sum of the currents received by first bit line BL1 412-1, and the total output signal 434 is a sum of the currents received by second bit line BL2 412-2.

Thus, in the example shown in FIG. 4, total output signal 432 of the first bit line BL1 412-1 is representative of the image charge photogenerated in the four photodiodes 414 that are under blue "B" color filters in Rows R and R+1 of the column. Similarly, total output signal 434 of the second bit line BL2 412-2 is representative of the image charge photogenerated in the four photodiodes 414 that are under blue "B" color filters in Rows R+2 and R+3 of the column. As can be appreciated, the image charge read out from each four photodiode grouping of blue "B" photodiodes is read out via two floating diffusions instead one floating diffusion in accordance with the teachings of the present invention.

Continuing the example shown in FIG. 4, the photodiodes 414 that are under green "G" color filters are read out during READ PERIOD 2 as shown. The photodiodes 414 that are under the green "G" color filters are labeled with a "G" and are inside the dashed oval lines under READ PERIOD 2 in FIG. 4. In the example in which PDAF photodiodes are interspersed among the regular image sensing photodiodes, photodiodes that are labeled "PD" may also be read out during this read period.

One difference between the example depicted in FIG. 4 and the example depicted in FIG. 3 is that in the example depicted in FIG. 4, only some of the green "G" or some of the PDAF photodiodes "PD" are read out during each read period. In the example, the other green "G" or other PDAF photodiodes "PD" are read out in a separate read period. In the example, the readings from the green photodiodes "G" or PDAF photodiodes "PD" are stored and may then be combined with separate readouts from the remaining green photodiodes "G" or PDAF photodiodes "PD" separately to provide the full readout signal.

To illustrate, the example depicted in FIG. 4 shows the transfer transistors 416 that are coupled to the photodiodes 414 that are under the green "G" color filters or that are under the PDAF lenses "PD" are selectively turned ON as shown in the pixel circuit 404 of Row R and in the pixel circuit 404 of Row R+2. The transfer transistors 416 that are not coupled to the photodiodes 414 that are under the green "G" color filters or under the PDAF lenses "PD" in Row R or Row R+2 are selectively turned OFF as shown. In addition, none of the transfer transistors 416 in the pixel circuits 404 of Row R+1 or R+3 are turned ON. Therefore, it is noted that only two out of the four transfer transistors 416 of each pixel circuit 404 in Row R and in Row R+2 is turned ON at a time in accordance with the teachings of the present invention. As such, each respective floating diffusion 418 in each pixel circuit 404 that is selectively coupled to receive the image charge, receives image charge that is generated from only two photodiodes 414 out of the four photodiodes 414 in each 2×2 grouping of photodiodes in Row R and Row R+2. Since only up to two out of the four transfer transistors 414 is turned ON in the pixel circuits that are read out, it is appreciated that the full well capacity of each floating diffusion 418 is not exceeded during READ PERIOD 2 in accordance with the teachings of the present invention.

Each buffer transistor 424 of each pixel circuit 404 generates a respective output signal 430 in response to the image charge transferred to the respective floating diffusion 418 through the respective transfer transistors 416 that are selectively turned ON. Thus, in the example shown in FIG. 4 during READ PERIOD 2, total output signal 432 of the first bit line BL1 412-1 is received from output signal 430-0, which is received through the select transistor 426 of Row R, and is representative of the image charge photogenerated in the two photodiodes 414 that are under the green "G" color filters or PDAF lenses "PD" in Row R of the column. It is noted that the select transistor 426 of Row R+1 is turned OFF during READ PERIOD 2.

Similarly, during READ PERIOD 2, total output signal 434 of the second bit line BL1 412-2 is received from output signal 430-2, which is received through the select transistor 426 of Row R+2, and is representative of the image charge photogenerated in the two photodiodes 414 that are under the green "G" color filters in Row R+2 of the column. It is noted that the select transistor 426 of Row R+3 is turned OFF during READ PERIOD 2.

Continuing the example shown in FIG. 4, the remaining photodiodes 414 that are under green "G" color filters or under the PDAF lenses "PD" are read out during READ PERIOD 3 as shown. The remaining photodiodes 414 that are under the green "G" color filters are labeled with a "G" or under the PDAF lenses "PD" and are inside the dashed oval lines under READ PERIOD 3 in FIG. 4. In the example, the photodiodes 414 that are under green "G" color filters or under the PDAF lenses "PD" that are read out during READ PERIOD 3 may have their readings combined with the separate readouts of other photodiodes 414 that are under green "G" color filters or under the PDAF lenses "PD" that were read out at a different time. As such, it is appreciated that the readouts of photodiodes 414 that are under green "G" color filters or under the PDAF lenses "PD" may be combined with neighboring photodiodes 414 that are under green "G" color filters or under the PDAF lenses "PD" to realize improved resolution in the vertical direction compared to the example discussed in FIG. 3. It is appreciated that this benefit is also provided in the next column to the right for a red channel.

As shown in the example depicted in FIG. 4, the transfer transistors 416 that are coupled to the photodiodes 414 that are under the green "G" color filters or that are under the PDAF lenses "PD" are selectively turned ON as shown in the pixel circuit 404 of Row R+1 and in the pixel circuit 404 of Row R+3. The transfer transistors 416 that are not coupled to the photodiodes 414 that are under the green "G" color filters or under the PDAF lenses "PD" in Row R+1 or Row R+3 are selectively turned OFF as shown. Therefore, it is noted that only two out of the four transfer transistors 416 of each pixel circuit 404 in Row R+1 and in Row R+3 is turned ON at a time in accordance with the teachings of the present invention. In addition, none of the transfer transistors 416 in the pixel circuits 404 of Row R or R+2 are turned ON, as these photodiodes were already read out separately in READ PERIOD 2. As such, each respective floating diffusion 418 in each pixel circuit 404 that is selectively coupled to receive the image charge, receives image charge that is generated from only two photodiodes 414 out of the four photodiodes 414 in each 2×2 grouping of photodiodes in Row R+1 and Row R+3, and none of the photodiodes from Row R and Row R+2. Since only up to two out of the four transfer transistors 414 is turned ON in the pixel circuits 404 that are read out, it is appreciated that the full well capacity of each floating diffusion 418 is not exceeded during READ PERIOD 3 in accordance with the teachings of the present invention.

Each buffer transistor 424 of each pixel circuit 404 generates a respective output signal 430 in response to the image charge transferred to the respective floating diffusion 418 through the respective transfer transistors 416 that are selectively turned ON. Thus, in the example shown in FIG. 4 during READ PERIOD 3, total output signal 432 of the first bit line BL1 412-1 is received from output signal 430-1, which is received through the select transistor 426 of Row R+1, and is representative of the image charge photogenerated in the two photodiodes 414 that are under the green "G" color filters in Row R+1 of the column. It is noted that the select transistor 426 of Row R is turned OFF during READ PERIOD 3.

Similarly, during READ PERIOD 3, total output signal 434 of the second bit line BL1 412-2 is received from output signal 430-3, which is received through the select transistor 426 of Row R+3, and is representative of the image charge photogenerated in the two photodiodes 414 that are under the green "G" color filters or PDAF lenses "PD" in Row R+3 of the column. It is noted that the select transistor 426 of Row R+2 is turned OFF during READ PERIOD 3.

It is noted that the readout of the green "G" photodiodes from the pixel circuit 404 of Row R+1 during READ PERIOD 3 may be combined with the stored readout of the green "G" photodiodes from the pixel circuit 404 of Row R+2 during READ PERIOD 2 to realize improved resolution in the vertical direction in accordance with the teachings of the present invention. Furthermore, it is appreciated that the readout of the green "G" or photodiodes or the PDAF photodiodes "PD" from the pixel circuit 404 of Row R during READ PERIOD 2, or the readout of the green "G" or photodiodes or the PDAF photodiodes "PD" from the pixel circuit 404 of Row R+3 during READ PERIOD 3, may also be combined with the stored readouts of the green "G" photodiodes or PDAF photodiodes "PD" from different read periods to realize improved resolution in the vertical direction in accordance with the teachings of the present invention.

FIGS. 5A-5E show one example of a read out of yet another example schematic of a column of groupings of photodiodes included in a color pixel array 502 of an imaging system with a shifted color filter array pattern and bit line pairs in accordance with the teachings of the present invention. It is appreciated the color pixel array 502 of FIGS. 5A-5E may be another example of a pixel circuitry discussed above in FIGS. 2B-4 or the pixel array 102 as discussed in FIGS. 1A-1B, and that similarly named and numbered elements described above are coupled and function similarly below.

In the example shown in FIGS. 5A-5E, a column of pixels circuits 504 is shown. It is noted that FIGS. 5A-5E illustrate a single column of pixel circuits 504 and that the bottom of the column on the left-hand side of FIGS. 5A-5E continues at the top right-hand side of FIGS. 5A-5E. Thus, "below" the pixel circuit 504 in Row N on the lower left-hand side of FIGS. 5A-5E is the pixel circuit 504 in Row N+1 on the upper right-hand side of FIGS. 5A-5E.

Similar to the examples illustrated in FIGS. 3-4, each pixel circuit 504 shown in FIGS. 5A-5E is another example of pixel circuit 104 described in FIG. 1B. Thus, similarly named and numbered elements described above in FIG. 1B are coupled and function similarly in FIGS. 5A-5E. In addition, the column of pixel circuits 504 may be a schematic example of the left most column of color pixel array 202B shown in FIG. 2B, which includes a repeating pattern of green, blue, green, blue, and green color filters from top to bottom. As shown, in FIGS. 5A-5E, each pixel circuit 504 includes a 2×2 grouping of four photodiodes 514.

In the example in FIGS. 5A-5E, the pixel circuit 504 in Row 1 of color pixel array 502 includes green "G" photodiodes, or in another example PDAF photodiodes "PD" 514-1, 514-2 on the top, and blue "B" photodiodes 514-3, 514-4 on the bottom. Similarly, the pixel circuits 504 of the following Rows 2, . . . , N−1, N, N+1, N+2, . . . , 2N−1, and 2N include a repeating pattern from top to bottom of blue "B" and green "G", green "G" and blue "B", blue "B" and green "G", green "G" and blue "B", blue "B" and green "G", green "G" and blue "B", blue "B" and green "G" photodiodes, and so on down the column. In another example, in which PDAF photodiodes "PD" are included, it is appreciated that the green "G" photodiodes in the pixel circuits 504 of Rows N, N+1, and 2N are instead replaced with PDAF photodiodes "PD" as shown.

Thus, it is appreciated that the example column of pixel circuits 504 shown in FIGS. 5A-5E illustrates 2N pixel circuits 504, with N=4 as eight pixel circuits 504 are illustrated in the specific example shown in FIGS. 5A-5E. However, in other examples, it is appreciated the N can be a lower or a higher number, such as for example N=8, etc. In the depicted example, there is a repeating pattern with the first N rows of pixel circuits 504 have select transistors 526 coupled to the first bit line BL1 512-1, and the next N rows of pixel circuits 504 with select transistors coupled to the second bit line BL2 512-2, and so on down the column. In the examples with interspersed PDAF photodiodes "PD," the PDAF photodiodes "PD" located in Row 1, Row N, Row N+1, and Row 2N as shown. In one example, it is appreciated that the buffer transistors 524 in a column of pixel circuits 504 that are coupled through respective select transistors 526 to the first bit line BL1 512-1 may be considered as being in a first grouping of buffer transistors, and the buffer transistors 524 that are coupled through respective select transistors 526 to the second bit line BL2 512-2 may be considered as being in a second grouping of buffer transistors.

Figure 5A:
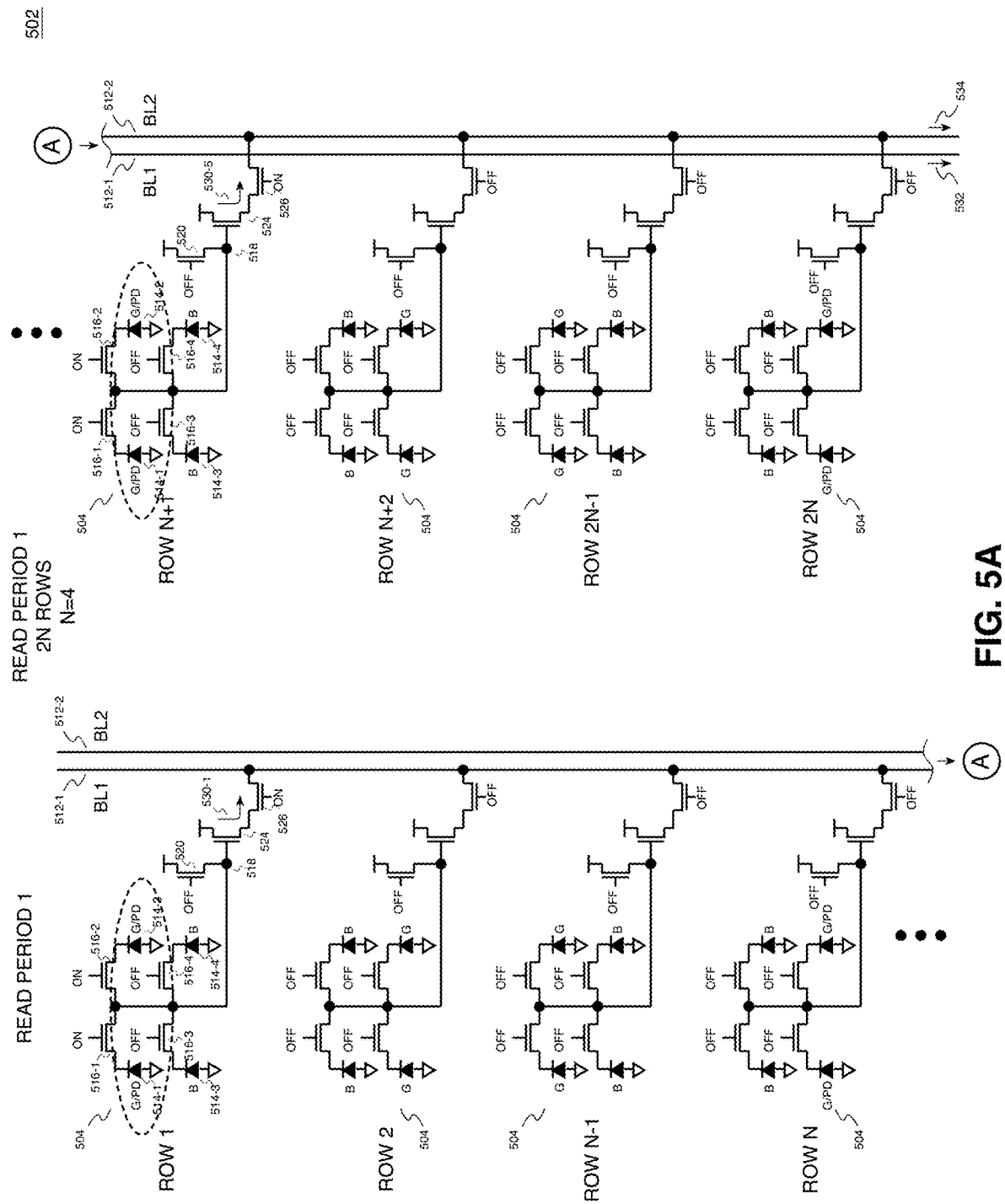
FIGS. 5A-5E show one example of a read out of yet another example schematic of a column of groupings of photodiodes included in an imaging system with a shifted color filter array pattern and bit line pairs in accordance with the teachings of the present invention.

The example depicted in FIG. 5A shows READ PERIOD 1, during which the green "G" photodiodes or the PDAF photodiodes "PD" are read out from Row 1 and from Row N+1. Thus, in an example in which N=4, the green "G" photodiodes or the PDAF photodiodes "PD" are read out from Row 1 and from Row 5. Similarly, in an example in which N=8, the green "G" photodiodes or the PDAF photodiodes "PD" are read out from Row 1 and from Row 9, and so on. The photodiodes 514 that are being read out and are under the green "G" color filters are labeled with a "G" or the photodiodes 514 that are under the PDAF lenses are labeled with a "PD" and are inside the dashed oval lines under READ PERIOD 1 in FIG. 5A.

The transfer transistors 516 that are coupled to the photodiodes 514 that are under the green "G" color filters or the PDAF photodiodes "PD" are selectively turned ON as shown in Rows 1 and N+1, and the transfer transistors 516 that are not coupled to the photodiodes 514 that are under the green "G" color filters or the PDAF photodiodes "PD" are selectively turned OFF as shown. All of the transfer transistors in the pixel circuits 504 of Rows 2, ..., N−1, N, N+2, ..., 2N−1, and 2N are turned OFF. Therefore, it is noted that only two out of the four transfer transistors 516 of each pixel circuit 504 are turned ON at a time in the pixel circuits 504 that are read out from Rows 1 and N+1 during READ PERIOD 1 in accordance with the teachings of the present invention. As such, each respective floating diffusion 518 in each pixel circuit 504 that is read out is selectively coupled to receive the image charge generated from only the two photodiodes 514 that are under a green "G" color filter or the PDAF photodiodes "PD" out of the four photodiodes 514 in each 2×2 grouping of photodiodes. Since only two out of the four transfer transistors 514 are turned ON at a time in the pixel circuits 504 that are read out from Rows 1 and N+1 during READ PERIOD 1, it is appreciated that the full well capacity of each floating diffusion 518 is not exceeded in accordance with the teachings of the present invention.

Each buffer transistor 524 of each pixel circuit 504 generates a respective output signal 530 in response to the image charge transferred to the respective floating diffusion 518 through the two respective transfer transistors 516 that are selectively turned ON. In FIG. 5A during READ PERIOD 1, only the buffer transistors 524 of pixel circuits 504 of Rows 1 and N+1 generate respective output signals 530-1, 530-5, as the pixel circuits 504 of Rows 2, ..., N−1, N, N+2, ..., 2N−1, and 2N are not read out during READ PERIOD 1. As shown in the example, a pair of bit lines 512 is coupled to each column of pixel circuits 504. In the depicted example, the buffer transistors 524 of the pixel circuits 504 of Rows 1 and N+1 are coupled through respective select transistors 526 to the first bit line BL1 512-1, and to the to the second bit line BL2 512-2, respectively.

During READ PERIOD 1 as shown in FIG. 5A, the output signal 530-1 from the pixel circuit 504 of Row 1 is coupled to be received by the first bit line BL1 512-1, and the output signal 530-5 from the pixel circuit 504 of Row N+1 is coupled to be received by the second bit line BL2 512-2. In the examples depicted in FIGS. 5A-5E, each bit line 512 is coupled to receive only up to two output signals 530 from up to two buffer transistors 524 at a time. In the specific example depicted in FIG. 5A during READ PERIOD 1, each bit line 512 is coupled to receive only one output signal 530-1, 530-5, respectively, from buffer transistors 524 of pixel circuits 504 of Rows 1 and N+1, respectively, at a time. In one example, the output signal 530 generated by each buffer transistor 524 comprises a current. Therefore, the total output signal 532 is a sum of the currents received by first bit line BL1 512-1, and the total output signal 534 is a sum of the currents received by second bit line BL2 512-2. Since only one output signal 530 is received by first bit line BL1 512-1 and by second bit line BL2 512-2 during READ PERIOD 1, total output signal 532 is equal to output signal 530-1 and total output signal 534 is equal to output signal 530-5 during READ PERIOD 1.

Figure 5B:
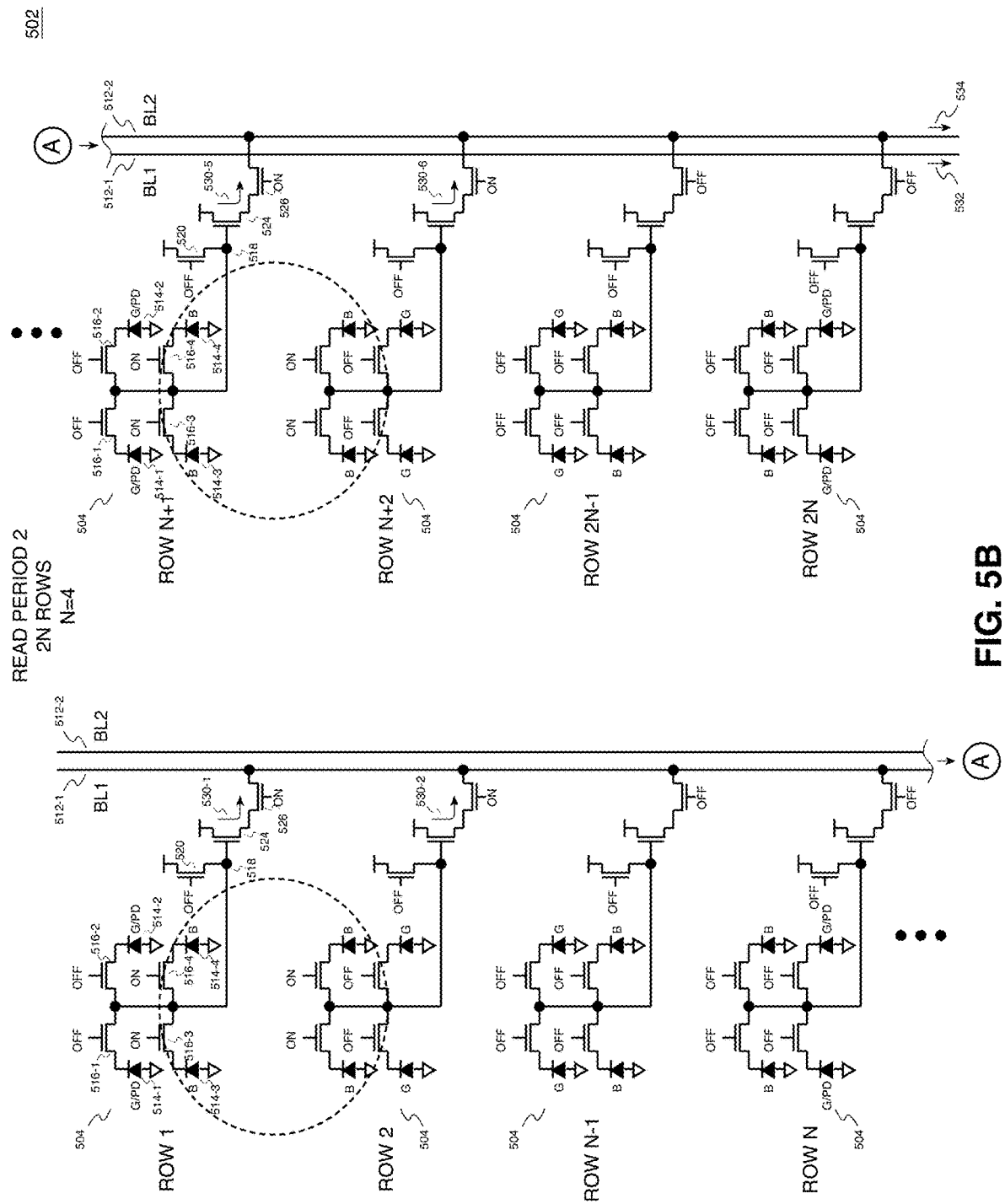

The example depicted in FIG. 5B shows READ PERIOD 2, during which the blue "B" photodiodes are read out from Rows 1 and 2, and from Rows N+1 and N+2. Thus, in an example in which N=4, the blue "B" photodiodes are read out from Rows 1 and 2, and from Rows 5 and 6. Similarly, in an example in which N=8, the blue "B" photodiodes are read out from Rows 1 and 2, and from Rows 9 and 10, and so on. The photodiodes 514 that are being read out and under the blue "B" color filters are inside the dashed oval lines under READ PERIOD 2 in FIG. 5B.

The transfer transistors 516 that are coupled to the photodiodes 514 that are under the blue "B" color filters are selectively turned ON as shown in Rows 1 and 2, and the transfer transistors 516 that are not coupled to the photodiodes 514 that are under the blue "B" color filters or are selectively turned OFF as shown. All of the transfer transistors in the pixel circuits 504 of remaining Rows N−1, N, N+2, ..., 2N−1, and 2N are turned OFF. Therefore, it is noted that only two out of the four transfer transistors 516 of each pixel circuit 504 are turned ON at a time in the pixel circuits 504 that are read out from Rows 1 and 2 and Rows N+1 and N+2 during READ PERIOD 2 in accordance with the teachings of the present invention. As such, each respective floating diffusion 518 in each pixel circuit 504 that is read out is selectively coupled to receive the image charge generated from only the two photodiodes 514 that are under a blue "B" color filter out of the four photodiodes 514 in each 2×2 grouping of photodiodes. Since only two out of the four transfer transistors 514 are turned ON at a time in the pixel circuits 504 that are read out from Rows 1 and 2, and Rows N+1 and N+2 during READ PERIOD 2, it is appreciated that the full well capacity of each floating diffusion 518 is not exceeded in accordance with the teachings of the present invention.

Each buffer transistor 524 of each pixel circuit 504 generates a respective output signal 530 in response to the image charge transferred to the respective floating diffusion 518 through the two respective transfer transistors 516 that are selectively turned ON. In FIG. 5B during READ PERIOD 2, only the buffer transistors 524 of pixel circuits 504 of Rows 1 and 2, and rows N+1 and N+2 generate respective output signals 530-1 and 530-2, and output signals 530-5 and 530-6, respectively, as the pixel circuits 504 of remaining Rows N−1, N, ..., 2N−1, and 2N are not read out during READ PERIOD 2. As shown in the example, a pair of bit lines 512 is coupled to each column of pixel circuits 504. In the depicted example, the buffer transistors 524 of the pixel circuits 504 of Rows 1 and 2, and Rows N+1 and N+2 are coupled through respective select transistors 526 to the first bit line BL1 512-1, and to the to the second bit line BL2 512-2, respectively.

During READ PERIOD 2 as shown in FIG. 5B, the output signals 530-1 and 530-2 from the pixel circuits 504 of Rows 1 and 2 are coupled to be received by the first bit line BL1 512-1, and the output signals 530-5 and 530-6 from the pixel circuits 504 of Rows N+1 and N+2 are coupled to be received by the second bit line BL2 512-2. Therefore, the total output signal 532 is a sum of the currents received by first bit line BL1 512-1, which is equal to the sum of output signals 530-1 and 530-2 from the pixel circuits 504 of Rows 1 and 2 during READ PERIOD 2. Similarly, the total output signal 534 is a sum of the currents received by second bit line BL2 512-2, which is equal to the sum of output signals 530-5 and 530-6 from the pixel circuits 504 of Rows N+1 and N+2 during READ PERIOD 2.

Thus, in the example shown in FIG. 5B, total output signal 532 of the first bit line BL1 512-1 is representative of the image charge photogenerated in the four photodiodes 514 that are under blue "B" color filters in Rows 1 and 2 of the column. Similarly, total output signal 534 of the second bit line BL2 512-2 is representative of the image charge photogenerated in the four photodiodes 514 that are under blue "B" color filters in Rows N+1 and N+2 of the column. As can be appreciated, the image charge read out from each four photodiode grouping of blue "B" photodiodes is read out via two floating diffusions instead one floating diffusion in accordance with the teachings of the present invention.

Figure 5C:
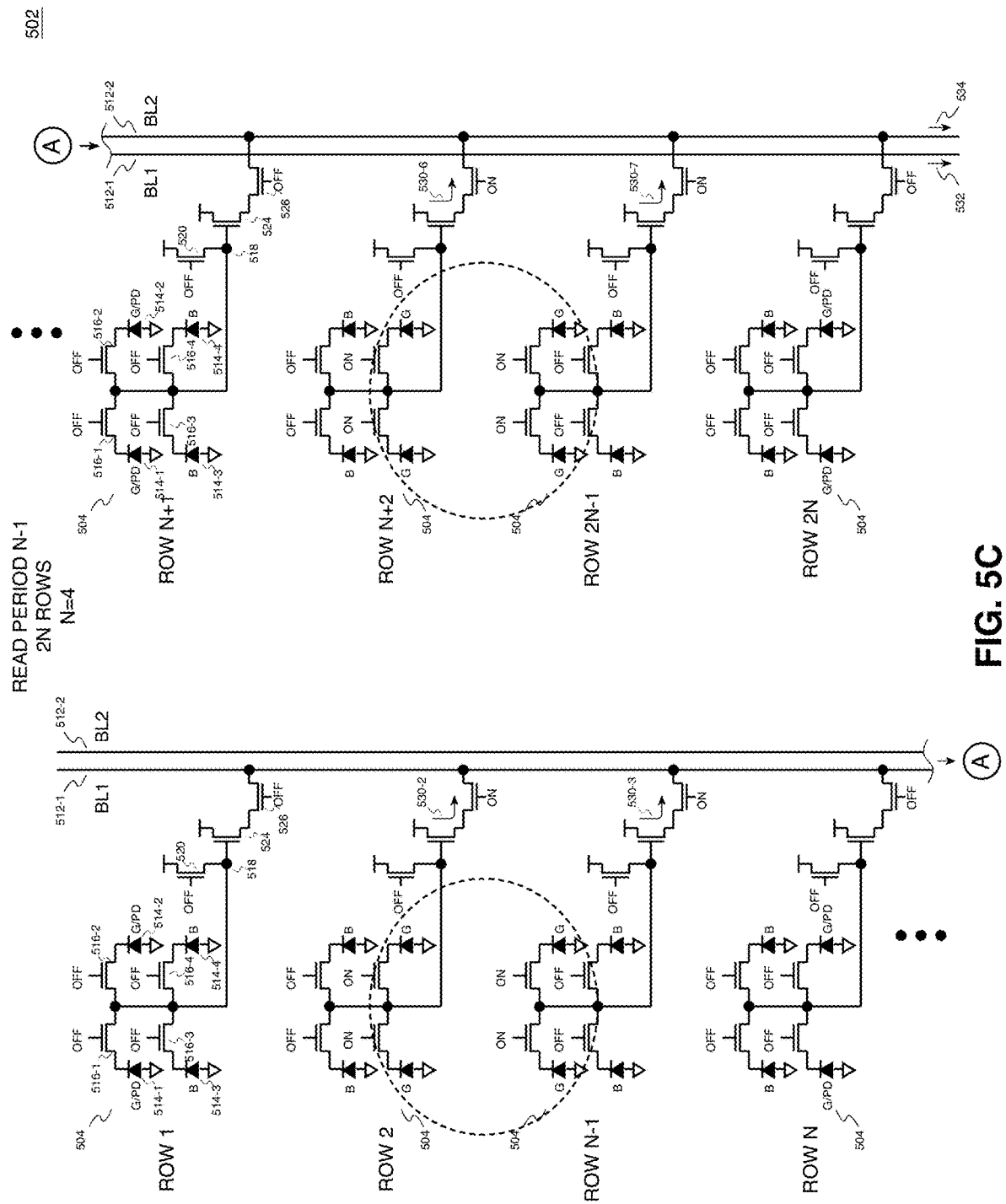

The example depicted in FIG. 5C shows READ PERIOD N−1, during which the green "G" photodiodes are read out from Rows 2 and N−1, and from Rows N+2 and 2N−1. Thus, in an example in which N=4, the green "G" photodiodes are read out from Rows 2 and 3, and from Rows 6 and 7. It is appreciated that in the example with N=4, "Row 2" may also be equivalent to "Row N−2" and that "Row N+2" may also be equivalent to "Row 2N−2". Therefore, in an example in which N=8, the green "G" photodiodes may therefore also be read out from Rows 6 and 7 (Rows N−2 and N−1), and from Rows 14 and 15 (Rows 2N−2 and 2N−1), and so on. The photodiodes 514 that are being read out and under the green "G" color filters are inside the dashed oval lines under READ PERIOD N−1 in FIG. 5C.

Operation of the color pixel array 502 in FIG. 5C is substantially similar to the operation of color pixel array 502 in the above-described FIG. 5B, with the exception that green "G" photodiodes are read out from Rows 2 and N−1 and Rows N+2 and 2N−1 (with N=4). Thus, only two out of the four transfer transistors 516 of each pixel circuit 504 are turned ON at a time in the pixel circuits 504 that are read out from Rows 2 and N−1 and Rows N+2 and 2N−1 during READ PERIOD N−1 in accordance with the teachings of the present invention. As such, each respective floating diffusion 518 in each pixel circuit 504 that is read out is selectively coupled to receive the image charge generated from only the two photodiodes 514 that are under a green "G" color filter out of the four photodiodes 514 in each 2×2 grouping of photodiodes. Since only two out of the four transfer transistors 514 are turned ON at a time in the pixel circuits 504 that are read out from Rows 2 and N−1 and Rows N+2 and 2N−1 during READ PERIOD N−1, it is appreciated that the full well capacity of each floating diffusion 518 is not exceeded in accordance with the teachings of the present invention.

In addition, during READ PERIOD N−1 as shown in FIG. 5C, the output signals 530-2 and 530-3 from the pixel circuits 504 of Rows 2 and N−1 are coupled to be received by the first bit line BL1 512-1, and the output signals 530-6 and 530-7 from the pixel circuits 504 of Rows N+2 and 2N−1 are coupled to be received by the second bit line BL2 512-2. Therefore, the total output signal 532 is a sum of the currents received by first bit line BL1 512-1, which is equal to the sum of output signals 530-2 and 530-3 from the pixel circuits 504 of Rows 2 and N−1 during READ PERIOD N−1. Similarly, the total output signal 534 is a sum of the currents received by second bit line BL2 512-2, which is equal to the sum of output signals 530-6 and 530-7 from the pixel circuits 504 of Rows N+2 and 2N−1 during READ PERIOD N−1.

Thus, in the example shown in FIG. 5C, total output signal 532 of the first bit line BL1 512-1 is representative of the image charge photogenerated in the four photodiodes 514 that are under green "G" color filters in Rows 2 and N−1 of the column. Similarly, total output signal 534 of the second bit line BL2 512-2 is representative of the image charge photogenerated in the four photodiodes 514 that are under green "G" color filters in Rows N+2 and 2N−1 of the column. As can be appreciated, the image charge read out from each four photodiode grouping of green "G" photodiodes is read out via two floating diffusions instead one floating diffusion in accordance with the teachings of the present invention.

Figure 5D:
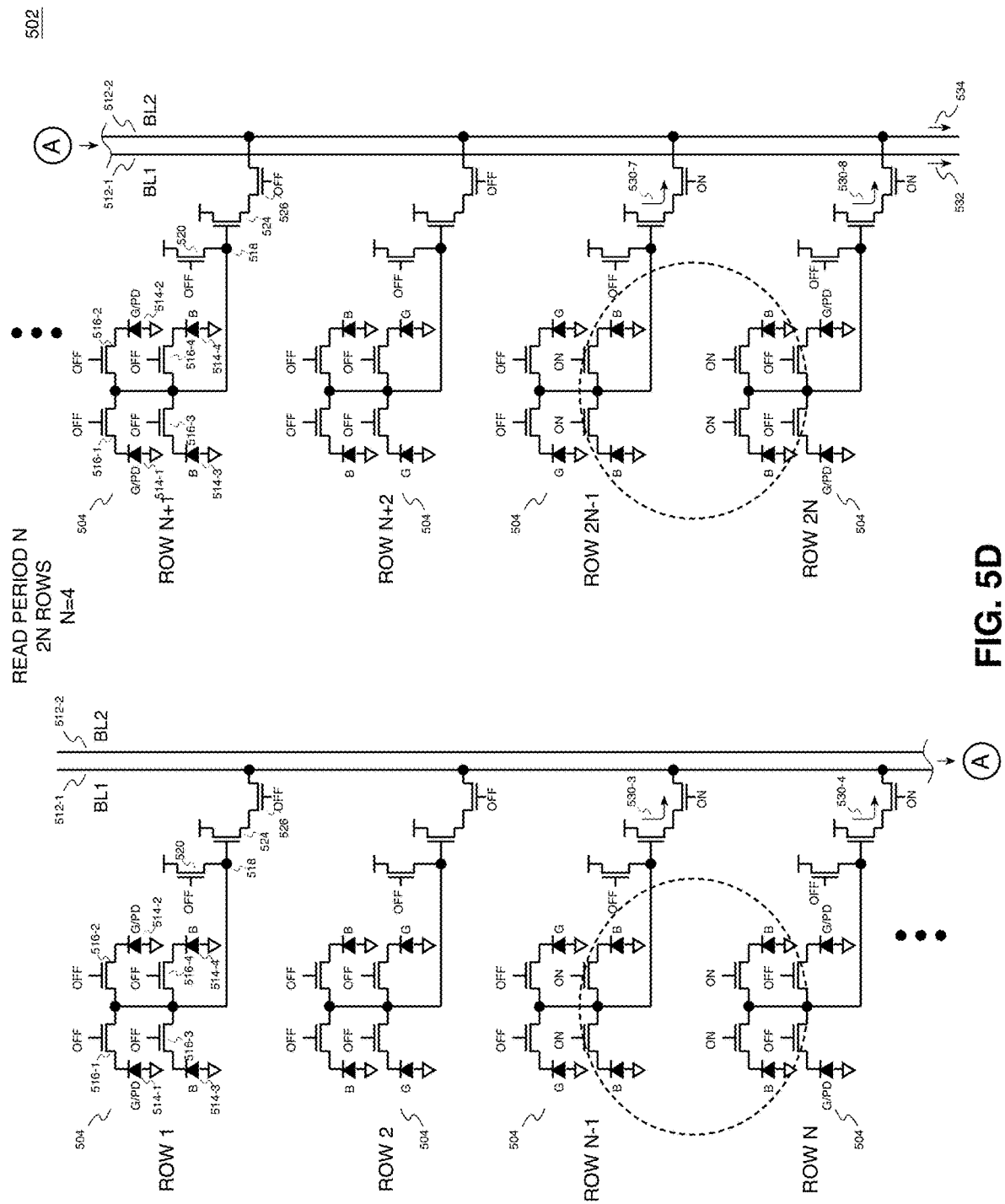

The example depicted in FIG. 5D shows READ PERIOD N, during which the blue "B" photodiodes are read out from Rows N−1 and N, and from Rows 2N−1 and 2N. Thus, in an example in which N=4, the blue "B" photodiodes are read out from Rows 3 and 4, and from Rows 7 and 8. Therefore, in an example in which N=8, the blue "B" photodiodes are therefore read out from Rows 7 and 8, and from Rows 15 and 16, and so on. The photodiodes 514 that are being read out and under the blue "B" color filters are inside the dashed oval lines under READ PERIOD N in FIG. 5D.

Operation of the color pixel array 502 in FIG. 5D is substantially similar to the operation of color pixel array 502 in the above-described FIGS. 5B-5C, with the exception that blue "B" photodiodes are read out from Rows N−1 and N, and Rows 2N−1 and 2N. Thus, only two out of the four transfer transistors 516 of each pixel circuit 504 are turned ON at a time in the pixel circuits 504 that are read out from Rows N−1 and N, and Rows 2N−1 and 2N during READ PERIOD N in accordance with the teachings of the present invention. As such, each respective floating diffusion 518 in each pixel circuit 504 that is read out is selectively coupled to receive the image charge generated from only the two photodiodes 514 that are under a blue "B" color filter out of the four photodiodes 514 in each 2×2 grouping of photodiodes. Since only two out of the four transfer transistors 514 are turned ON at a time in the pixel circuits 504 that are read out from Rows N−1 and N, and Rows 2N−1 and 2N during READ PERIOD N, it is appreciated that the full well capacity of each floating diffusion 518 is not exceeded in accordance with the teachings of the present invention.

In addition, during READ PERIOD N as shown in FIG. 5D, the output signals 530-3 and 530-4 from the pixel circuits 504 of Rows N−1 and N are coupled to be received by the first bit line BL1 512-1, and the output signals 530-7 and 530-8 from the pixel circuits 504 of Rows 2N−1 and 2N are coupled to be received by the second bit line BL2 512-2. Therefore, the total output signal 532 is a sum of the currents received by first bit line BL1 512-1, which is equal to the sum of output signals 530-3 and 530-4 from the pixel circuits 504 of Rows N−1 and N during READ PERIOD N. Similarly, the total output signal 534 is a sum of the currents received by second bit line BL2 512-2, which is equal to the sum of output signals 530-7 and 530-8 from the pixel circuits 504 of Rows 2N−1 and 2N during READ PERIOD N.

Thus, in the example shown in FIG. 5D, total output signal 532 of the first bit line BL1 512-1 is representative of the image charge photogenerated in the four photodiodes 514 that are under blue "B" color filters in Rows N−1 and N of the column. Similarly, total output signal 534 of the second bit line BL2 512-2 is representative of the image charge photogenerated in the four photodiodes 514 that are under blue "B" color filters in Rows 2N−1 and 2N of the column. As can be appreciated, the image charge read out from each four photodiode grouping of blue "B" photodiodes is read out via two floating diffusions instead one floating diffusion in accordance with the teachings of the present invention.

Figure 5E:
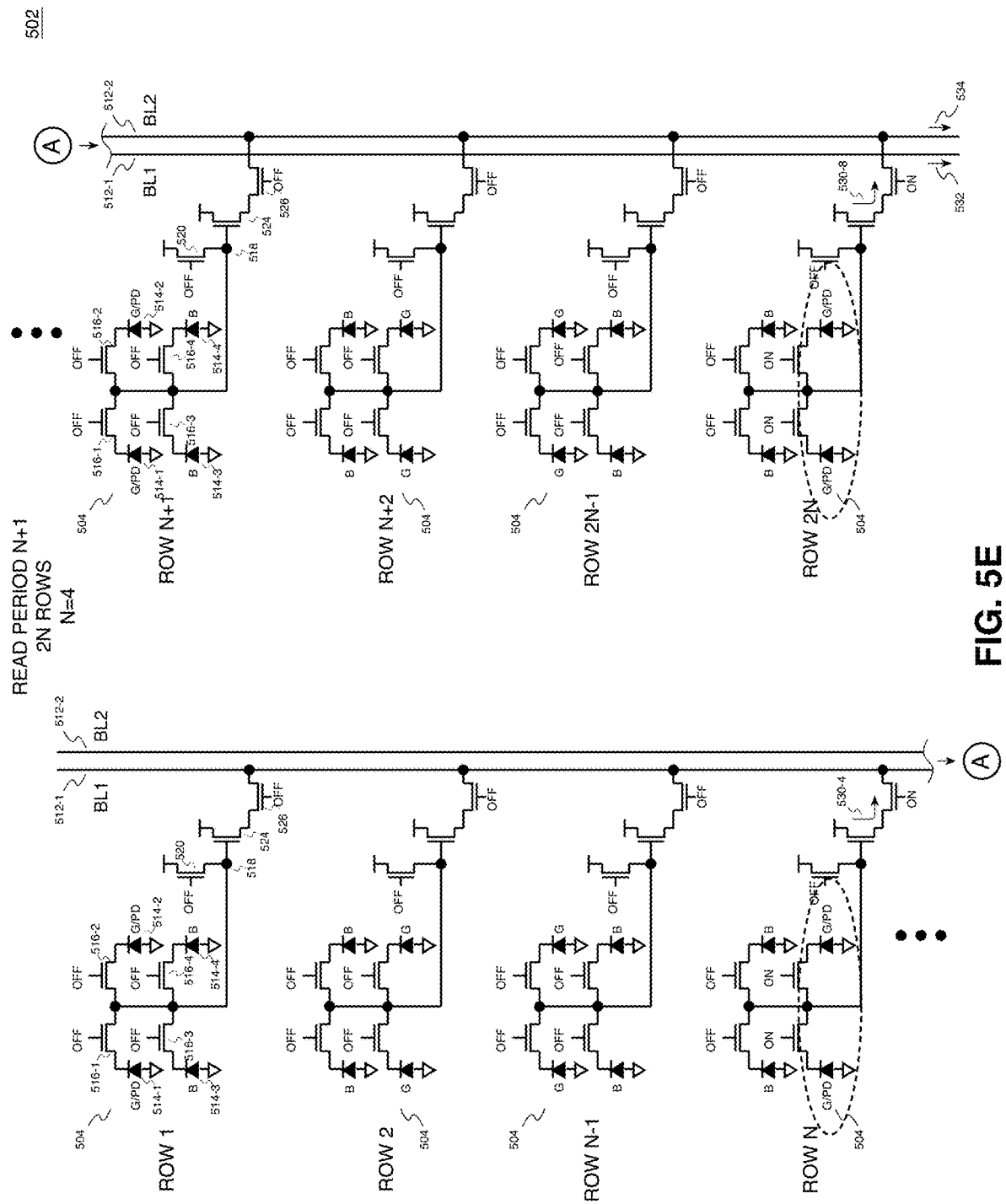

The example depicted in FIG. 5E shows READ PERIOD N+1, during which the green "G" photodiodes, or the PDAF photodiodes "PD" are read out from Row N and from Row 2N. Thus, in an example in which N=4, the green "G" photodiodes, or the PDAF photodiodes "PD" are read out from Rows 4 and 8. Therefore, in an example in which N=8, the green "G" photodiodes, or the PDAF photodiodes "PD" are therefore read out from Row 8 and Row 16, and so on. The green "G" photodiodes, or the PDAF photodiodes "PD" are being read out are inside the dashed oval lines under READ PERIOD N+1 in FIG. 5E.

Operation of the color pixel array 502 in FIG. 5E is substantially similar to the operation of color pixel array 502 in the above-described FIG. 5A, with the exception that green "G" photodiodes, or the PDAF photodiodes "PD" are read out from Rows N and 2N. Thus, only two out of the four transfer transistors 516 of each pixel circuit 504 are turned ON at a time in the pixel circuits 504 that are read out from Rows N and 2N, during READ PERIOD N+1 in accordance with the teachings of the present invention. As such, each respective floating diffusion 518 in each pixel circuit 504 that is read out is selectively coupled to receive the image charge generated from only the two photodiodes 514 that are under a green "G" color filter or the "PD" photodiodes out of the four photodiodes 514 in each 2×2 grouping of photodiodes. Since only two out of the four transfer transistors 514 are turned ON at a time in the pixel circuits 504 that are read out from Rows N and 2N during READ PERIOD N+1, it is appreciated that the full well capacity of each floating diffusion 518 is not exceeded in accordance with the teachings of the present invention.

In addition, during READ PERIOD N+1 as shown in FIG. 5E, the output signal 530-4 from the pixel circuit 504 of Row N is coupled to be received by the first bit line BL1 512-1, and the output signal 530-8 from the pixel circuit 504 of Row 2n is coupled to be received by the second bit line BL2 512-2. Since only one output signal 530 is received by first bit line BL1 512-1 and by second bit line BL2 512-2 during READ PERIOD N+1, total output signal 532 is equal to output signal 530-4 and total output signal 534 is equal to output signal 530-8 during READ PERIOD N+1.

Therefore, it is appreciated that with the example color pixel array 502 illustrated in FIGS. 5A-5E, 2N rows of 2×2 groupings of photodiodes can be read out in N+1 read periods. Thus, with N=4, 8 rows can be read out in 5 read periods, or with N=8, 16 rows can be read out in 9 read periods, and so on. In other words, with N=8, and therefore with 16 rows being read out in only 9 read periods, an average of only 2.25 read periods are required to read out 4 rows of 2×2 groupings of photodiodes (i.e., 4 rows of 4C cells) since 16/4=4, and since 9/4=2.25. Furthermore, it is appreciated that the example color pixel array 502 illustrated in FIGS. 5A-5E can also accommodate the optional to read out PDAF photodiodes "PD" interspersed among the pixel cells 504 as discussed in accordance with the teachings of the present invention.

Figure 6A:
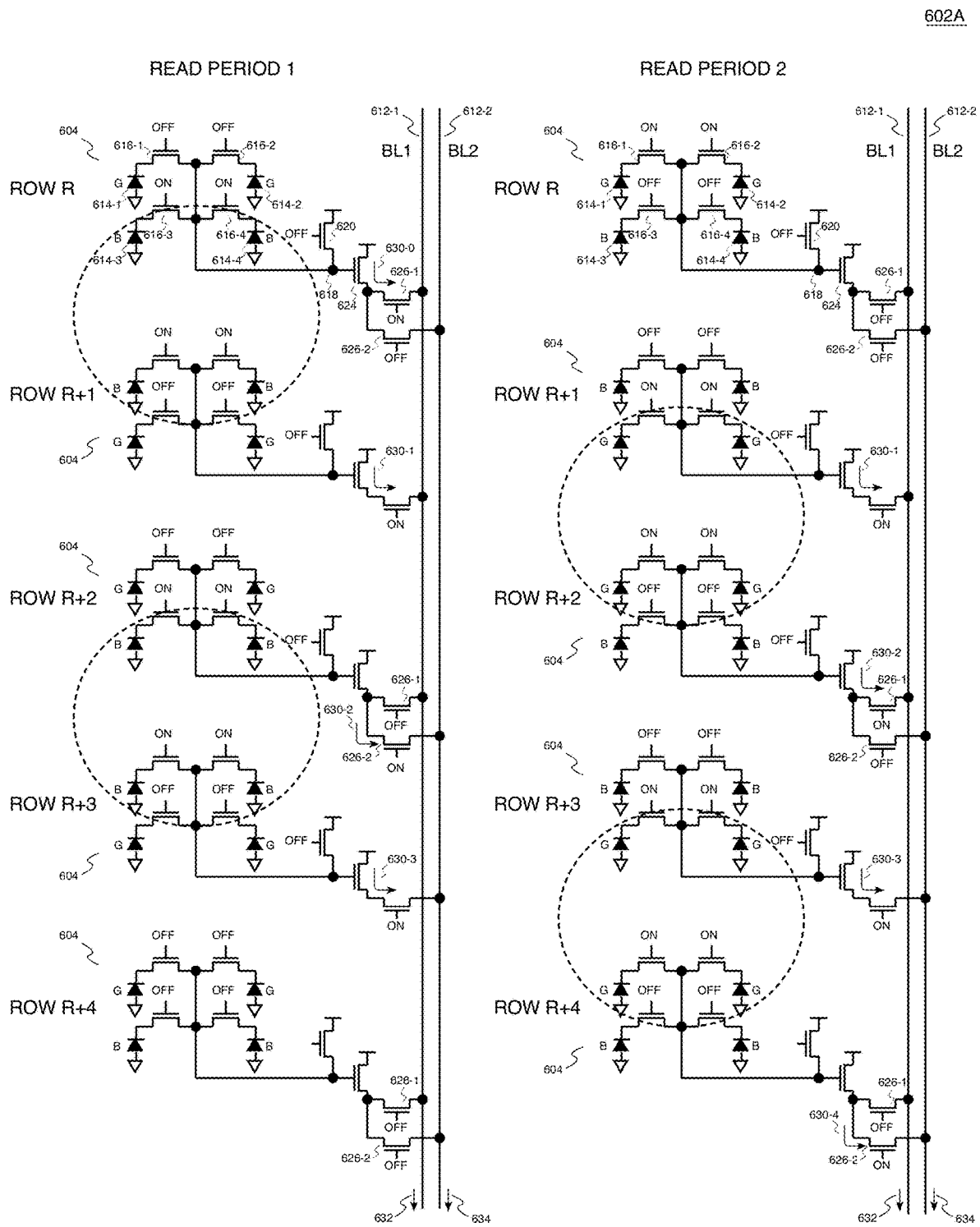
FIGS. 6A-6C show one example of a read out of still another example schematic of a column of groupings of photodiodes included in an imaging system with a shifted color filter array pattern and bit line pairs in accordance with the teachings of the present invention.
Figure 6B:
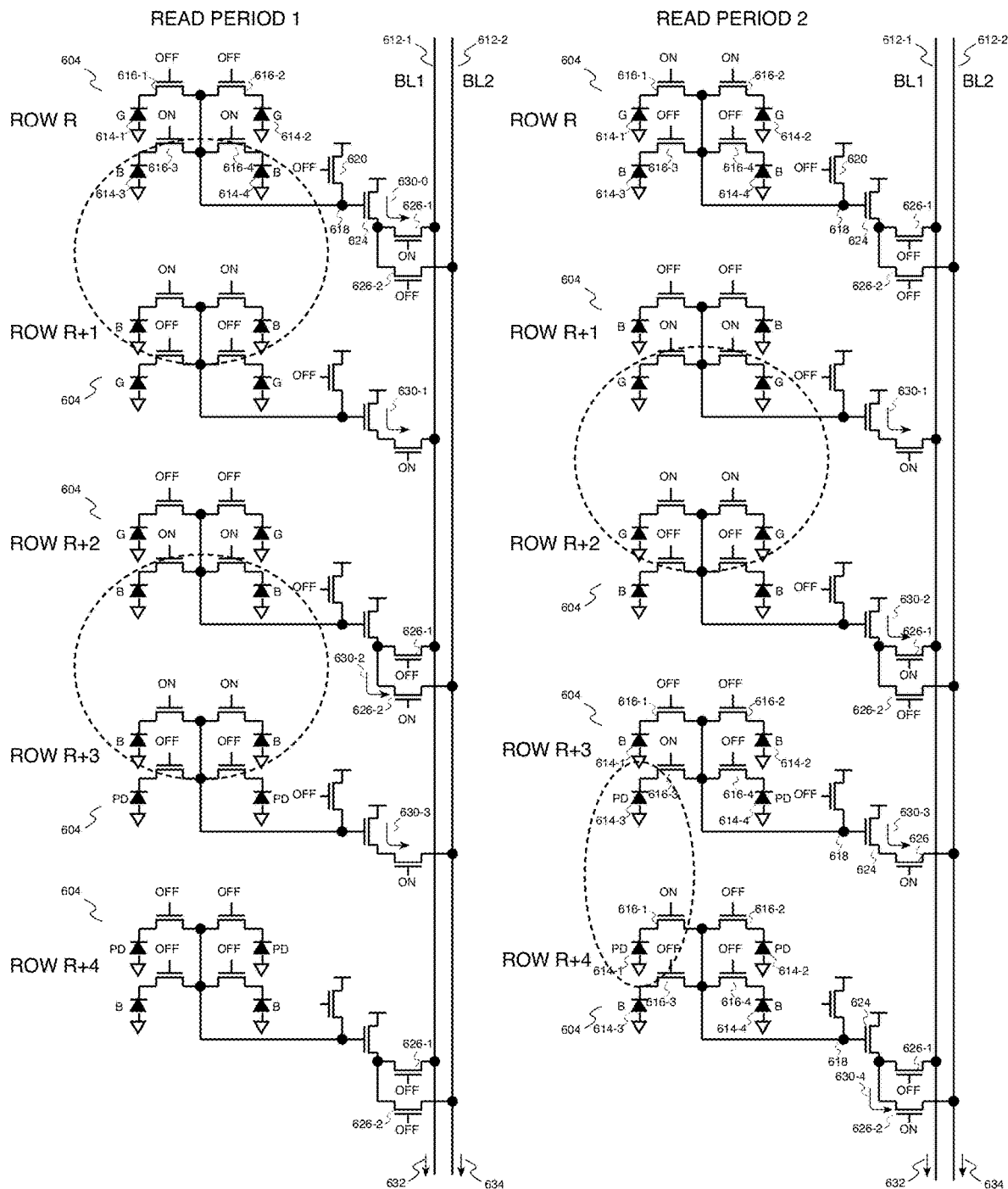
Figure 6C:
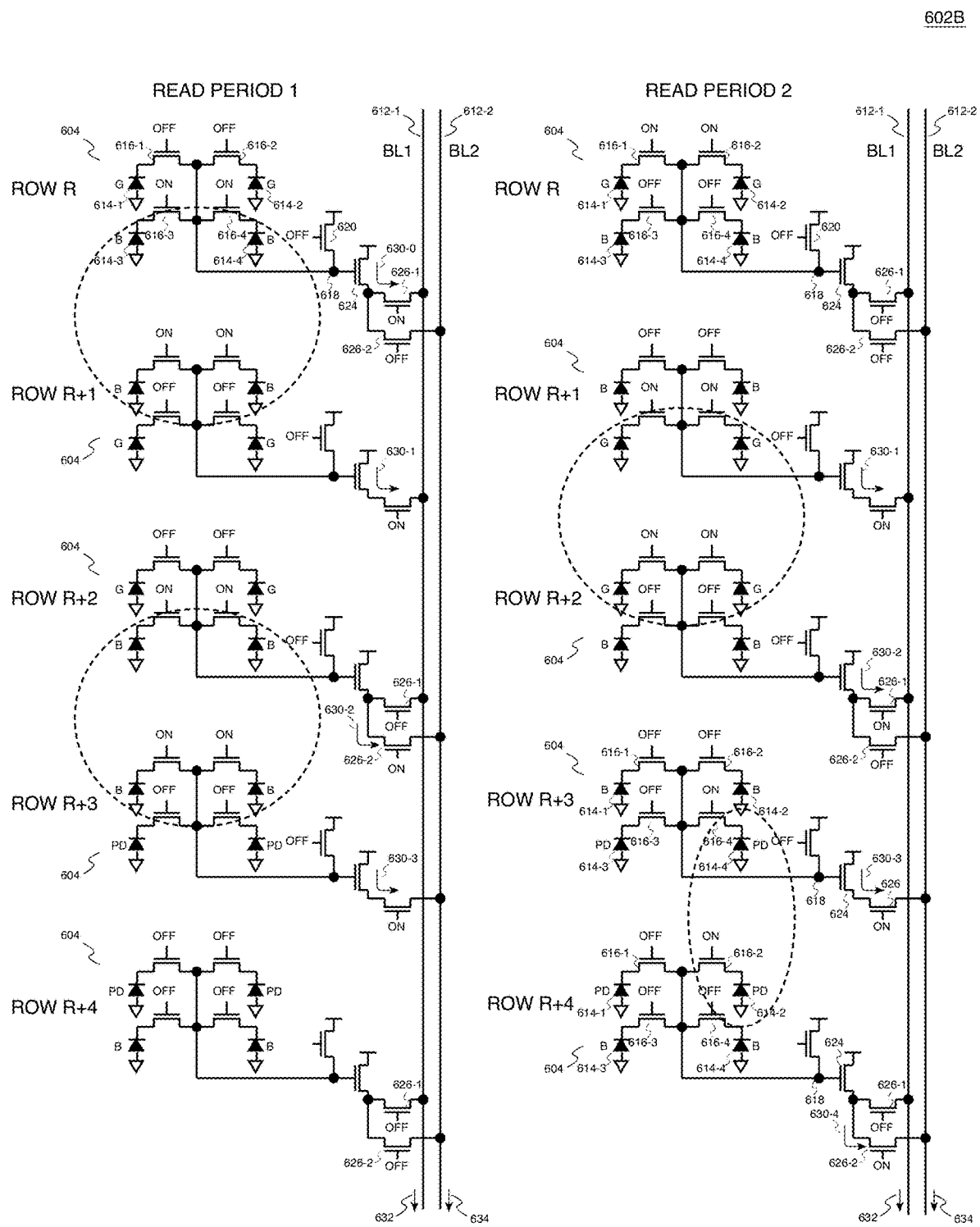

FIGS. 6A-6C show one example of a read out of still another example schematic of a column of groupings of photodiodes included in a color pixel array 602 of an imaging system with a shifted color filter array pattern and bit line pairs in accordance with the teachings of the present invention. It is appreciated the color pixel array 602 of FIGS. 6A-6C may be yet another example of a pixel circuitry discussed above in FIGS. 2B-5E or the pixel array 102 as discussed in FIG. 1A-1B, and that similarly named and numbered elements described above are coupled and function similarly below.

In the examples shown in FIGS. 6A-6C, a column of pixel circuits 604 is shown. As can be appreciated, each pixel circuit 604 shown in FIGS. 6A-6C is another example of pixel circuit 104 described in FIG. 1B. Thus, similarly named and numbered elements described above in FIG. 1B are coupled and function similarly in FIGS. 6A-6C. In addition, the column of pixel circuits 604 may be a schematic example of the left most column of color pixel array 202B shown in FIG. 2B, which includes a repeating pattern of green, blue, green, blue, and green color filters from top to bottom. As shown in FIG. 6A, each pixel circuit 604 includes a 2×2 grouping of four photodiodes 614. In the depicted example, the pixel circuit 604 in the top row R of color pixel array 602A includes green "G" photodiodes 614-1, 614-2 on the top, and blue "B" photodiodes 614-3, 614-4 on the bottom. Similarly, the pixel circuits 604 of the following rows R+1, R+2, R+3, and R+4 include a repeating pattern from top to bottom of blue "B" and green "G", green "G" and blue "B", blue "B" and green "G", and green "G" and blue "B" photodiodes. In the example, the pattern illustrated in FIG. 6A may continue along the column of pixel circuits 604.

In another example, it is appreciated that FIGS. 6B-6C also illustrate an example in which phase detection autofocus photodiodes (PDAF) may be interspersed in pixel circuits 604 in the color pixel array 602B to provide phase detection autofocus information to the imaging system. Thus, a difference between the example shown in FIGS. 6B-6C and the example shown in FIG. 6A is that in the example shown in FIGS. 6B-6C, the green "G" photodiodes in Rows R+3 and R+4 are instead configured as PDAF photodiodes, which are labeled "PD" in FIGS. 6B-6C. In the example, the pattern illustrated in FIGS. 6B-6C may continue along the column of pixel circuits 604. In one example, the PDAF photodiodes "PD" are disposed under respective PDAF lenses that are also interspersed throughout the color pixel array 602B.

Referring back to the example depicted in FIG. 6A, the photodiodes 614 that are under the blue "B" color filters are read out during READ PERIOD 1 as shown. The photodiodes 614 that are under the blue "B" color filters are labeled with a "B" and are inside the dashed oval lines under READ PERIOD 1 in FIG. 6A. The transfer transistors 616 that are coupled to the photodiodes 614 that are under the blue "B" color filters are selectively turned ON as shown, and the transfer transistors 616 that are not coupled to the photodiodes 614 that are under the blue "B" color filters are selectively turned OFF as shown. Therefore, it is noted that only two out of the four transfer transistors 616 of each pixel circuit 604 are turned ON at a time in accordance with the teachings of the present invention. As such, each respective floating diffusion 618 in each pixel circuit 604 is selectively coupled to receive the image charge generated from only the two photodiodes 614 that are under a blue "B" color filter out of the four photodiodes 614 in each 2×2 grouping of photodiodes. Since only two out of the four transfer transistors 614 are turned ON, it is appreciated that the full well capacity of each floating diffusion 618 is not exceeded in accordance with the teachings of the present invention.

Each buffer transistor 624 of each pixel circuit 604 generates a respective output signal 630 in response to the image charge transferred to the respective floating diffusion 618 through the two respective transfer transistors 616 that are selectively turned ON. As shown in the example, a pair of bit lines 612 is coupled to each column of pixel circuits 604. In the depicted example, the buffer transistors 624 of the pixel circuits 604 of Rows R and R+1 are coupled through respective select transistors 626 to the first bit line BL1 612-1, and the buffer transistors 624 of the pixel circuits 604 of Rows R+2 and R+3 are coupled to the second bit line BL2 612-2.

In one example, it is appreciated that the buffer transistors 624 in a column of pixel circuits 604 that are coupled through respective select transistors 626 to the first bit line BL1 612-1 may be considered as being in a first grouping of buffer transistors, and the buffer transistors 624 that are coupled through respective select transistors 626 to the second bit line BL2 612-2 may be considered as being in a second grouping of buffer transistors.

In the examples depicted in FIGS. 6A-6C, it is noted that the some of the pixel circuits 604 include two select transistors 626. In particular, as shown in the depicted examples, the pixel circuits 604 of Rows R, R+2, R+4, etc. include a first select transistor 626-1 coupled between the buffer transistor 624 and the first bit line BL1 612-1, as well as a second select transistor 626-2 coupled between the buffer transistor 624 and the second bit line BL1 612-2. Thus, in the depicted examples, these pixel circuits 604 have the flexibility of being selectively coupled to either the first bit line BL1 612-1 or the second bit line BL1 612-2.

Accordingly, in various examples, it is appreciated that the plurality of buffer transistors 624 in the color pixel array may be comprised of a first subset of buffer transistors 624 included in the first grouping, which are selectively coupled to the first bit line BL1 612-1 through a first select transistor 626-1, a second subset of buffer transistors included in the second grouping of buffer transistors, which are selectively coupled to the second bit line BL2 612-2 through a second select transistor 626-2, and a third subset of buffer transistors included in both the first grouping of buffer transistors and the second grouping of buffer transistors.

Therefore, in the depicted example, it is appreciated that the buffer transistors 624 of each respective pixel circuit 604 may be coupled to the pair of bit lines 612 from top to bottom in a repeating pattern of: a buffer transistor 624 of the third grouping (e.g., Row R selectively coupled to both first bit line BL1 612-1 and second bit line BL2 612-2 through first and second select transistors 626-1 and 626-2, respectively), a buffer transistors 624 of the first grouping (e.g., Row R+1 selectively coupled to first bit line BL1 612-1 a first select transistor 626-1), another buffer transistor 624 of the third grouping (e.g., Row R+2 selectively coupled to both first bit line BL1 612-1 and second bit line BL2 612-2 through first and second select transistors 626-1 and 626-2, respectively), a buffer transistors 624 of the second grouping (e.g., Row R+3 selectively coupled to second bit line BL2 612-1 a second select transistor 626-2), and so on. In one example, the pattern continues down the column.

During READ PERIOD 1 as shown in FIG. 6A, the output signal 630-0 from the pixel circuit 604 of Row R and the output signal 630-1 from the pixel circuit 604 of Row R+1 are both coupled to be received by the first bit line BL1 612-1. Similarly, the output signal 630-2 from the pixel circuit 604 of Row R+2 and the output signal 630-3 from the pixel circuit 604 of Row R+3 are both coupled to be received by the second bit line BL2 612-2. In the depicted example, each bit line 612 is coupled to receive only up to two output signals 630 from up to two buffer transistors 624 at a time. In one example, the output signal 630 generated by each buffer transistor 624 comprises a current. Therefore, the total output signal 632 is a sum of the currents received by first bit line BL1 612-1, and the total output signal 634 is a sum of the currents received by second bit line BL2 612-2.

Thus, in the example shown in FIG. 6A during READ PERIOD 1, total output signal 632 of the first bit line BL1 612-1 is representative of the image charge photogenerated in the four photodiodes 614 that are under blue "B" color filters in Rows R and R+1 of the column. Similarly, total output signal 634 of the second bit line BL2 612-2 is representative of the image charge photogenerated in the four photodiodes 614 that are under blue "B" color filters in Rows R+2 and R+3 of the column. As can be appreciated, the image charge read out from each four photodiode grouping of blue "B" photodiodes is read out via two floating diffusions instead one floating diffusion in accordance with the teachings of the present invention.

Continuing with the example depicted in FIG. 6A, the photodiodes 614 that are under the green "G" color filters are read out during READ PERIOD 2 as shown. The photodiodes 614 that are under the green "G" color filters are labeled with a "G" and are inside the dashed oval lines under READ PERIOD 2 in FIG. 6A. The transfer transistors 616 that are coupled to the photodiodes 614 that are under the green "G" color filters are selectively turned ON as shown, and the transfer transistors 616 that are not coupled to the photodiodes 614 that are under the green "G" color filters are selectively turned OFF as shown. Therefore, it is noted that only two out of the four transfer transistors 616 of each pixel circuit 604 are turned ON at a time in accordance with the teachings of the present invention. As such, each respective floating diffusion 618 in each pixel circuit 604 is selectively coupled to receive the image charge generated from only the two photodiodes 614 that are under a green "G" color filter out of the four photodiodes 614 in each 2×2 grouping of photodiodes. Since only two out of the four transfer transistors 614 are turned ON, it is appreciated that the full well capacity of each floating diffusion 618 is not exceeded in accordance with the teachings of the present invention.

Each buffer transistor 624 of each pixel circuit 604 generates a respective output signal 630 in response to the image charge transferred to the respective floating diffusion 618 through the two respective transfer transistors 616 that are selectively turned ON. In the depicted example, the buffer transistors 624 of the pixel circuits 604 of Rows R+1 and R+2 are coupled through respective select transistors 626 to the first bit line BL1 612-1, and the buffer transistors 624 of the pixel circuits 604 of Rows R+3 and R+4 are coupled to the second bit line BL2 612-2.

During READ PERIOD 2 as shown in FIG. 6A, the output signal 630-1 from the pixel circuit 604 of Row R+1 and the output signal 630-2 from the pixel circuit 604 of Row R+2 are both coupled to be received by the first bit line BL1 612-1. Similarly, the output signal 630-3 from the pixel circuit 604 of Row R+3 and the output signal 630-4 from the pixel circuit 604 of Row R+4 are both coupled to be received by the second bit line BL2 612-2. In the depicted example, each bit line 612 is coupled to receive only up to two output signals 630 from up to two buffer transistors 624 at a time. Therefore, the total output signal 632 is a sum of the currents received by first bit line BL1 612-1, and the total output signal 634 is a sum of the currents received by second bit line BL2 612-2.

Thus, in the example shown in FIG. 6A during READ PERIOD 2, total output signal 632 of the first bit line BL1 612-1 is representative of the image charge photogenerated in the four photodiodes 614 that are under green "G" color filters in Rows R+1 and R+2 of the column. Similarly, total output signal 634 of the second bit line BL2 612-2 is representative of the image charge photogenerated in the four photodiodes 614 that are under green "G" color filters in Rows R+3 and R+4 of the column. As can be appreciated, the image charge read out from each four photodiode grouping of green "G" photodiodes is read out via two floating diffusions instead one floating diffusion in accordance with the teachings of the present invention.

It is noted that with some of the rows being selectively coupled to both first bit line BL1 612-1 and second bit line BL2 612-2 through first select transistor 616-1 and second select transfer transistor 616-2, respectively as shown, one difference between the example shown in FIG. 6A and the previously described examples is that all of the photodiode groupings of the same color (e.g., blue, green, and red in the next column) that are read out are adjacent photodiode pairs from adjacent rows, which provides improved vertical resolution in accordance with the teachings of the present invention. For instance, the example shown in FIG. 6A makes this possible with the blue photodiodes "B" being read out from Row R+2 through second transfer transistor 616-2 to second bit line BL2 612-2 during READ PERIOD 1, and the green photodiodes "G" being read out from Row R+2 through first transfer transistor 616-1 to first bit line BL1 612-1 during READ PERIOD 2 as shown. Furthermore, only two read periods are needed to read out four rows of 2×2 grouping of photodiodes (e.g., 4C cells) in accordance with the teachings of the present invention.

As mentioned above, FIGS. 6B-6C illustrate another example in which phase detection autofocus photodiodes (PDAF) may be interspersed in pixel circuits 604 in the color pixel array 602B to provide phase detection autofocus information to the imaging system. Operation of the color pixel array 602B in FIGS. 6B-6C is substantially similar to the operation of color pixel array 602A in the above-described FIG. 6A during READ PERIOD 1 during which the photodiodes 614 under blue "B" color filters are read out. During READ PERIOD 2, the photodiodes 614 under the green "G" color filters are also read out from Rows R+1 and R+2 from color pixel array 602B of FIGS. 6B-6C in a substantially similar fashion as to how the green "G" color filters are read out from Rows R+1 and R+2 from color pixel array 602A of FIG. 6A.

However, the PDAF photodiodes "PD" are read out from rows R+3 and R+4 from color pixel array 602B of FIGS. 6B-6C during READ PERIOD 2. In particular, FIG. 6B illustrates an example in which the left pair of PDAF photodiodes "PD" are read out from rows R+3 and R+4 from color pixel array 602B, while FIG. 6C illustrates an example in which the right pair of PDAF photodiodes "PD" are read out from rows R+3 and R+4 from color pixel array 602B. With respect to the examples illustrated in FIGS. 6B-6C above, it is appreciated that the transfer transistor control signals coupled to be received by the transfer transistors 616 that are coupled to PDAF photodiodes "PD" are independent of the other transfer transistor control signals used to control the transfer transistors coupled to regular imaging photodiodes.

Referring now specifically to the example illustrated in FIG. 6B during READ PERIOD 2, the PDAF photodiodes "PD" are photodiodes 614-3 and 614-4 in Row R+3 and photodiodes 614-1 and 614-2 in Row R+4. The left pair of PDAF photodiodes "PD" in Rows R+3 and R+4 that are read out during READ PERIOD 2 of FIG. 6B are inside the tall and narrow dashed oval lines. The transfer transistors 616-3 of Row R+3 and 616-1 of Row R+4 that are coupled to the "PD" photodiodes 614 that are being read out are selectively turned ON as shown, and the transfer transistors 616-4 of Row R+3 and 616-2 of Row R+4 that are coupled to the "PD" photodiodes 614 that are not being read out are selectively turned OFF as shown.

The floating diffusion 618 that is coupled to transfer transistor 616-3 is coupled to receive the charge from the "PD" photodiode 614-3 of Row R+3. The floating diffusion 618 that is coupled to transfer transistor generates 616-1 is coupled to receive the charge from the "PD" photodiode 614-1 of Row R+4. Accordingly, the buffer transistor 614 of Row R+3 is coupled to generate an output signal 630-3, which is coupled to be received by second bit line BL2 612-2 through select transistor 626 of Row R+3 during READ PERIOD 2. Similarly, the buffer transistor 614 of Row R+4 is coupled to generate an output signal 630-4, which is also coupled to be received by second bit line BL2 612-2 through second select transistor 626-2 of Row R+4 during READ PERIOD 2. In one example, the output signal 630 generated by each buffer transistor 624 comprises a current. Therefore, the total output signal 634 for the readout of the left pair of "PD" photodiodes is a sum of the currents received by second bit line BL2 612-2 during READ PERIOD 2 of FIG. 6B.

Referring now specifically to the example illustrated in FIG. 6C during READ PERIOD 2, the right pair of PDAF photodiodes "PD" in Rows R+3 and R+4 that are read out during READ PERIOD 2 of FIG. 6C are inside the tall and narrow dashed oval lines. The transfer transistors 616-4 of Row R+3 and 616-2 of Row R+4 that are coupled to the "PD" photodiodes 614 that are being read out are selectively turned ON as shown, and the transfer transistors 616-3 of Row R+3 and 616-1 of Row R+4 that are coupled to the "PD" photodiodes 614 that are not being read out are selectively turned OFF as shown.

The floating diffusion 618 that is coupled to transfer transistor 616-4 is coupled to receive the charge from the "PD" photodiode 614-4 of Row R+3. The floating diffusion 618 that is coupled to transfer transistor generates 616-2 is coupled to receive the charge from the "PD" photodiode 614-2 of Row R+4. Accordingly, the buffer transistor 614 of Row R+3 is coupled to generate an output signal 630-3, which is coupled to be received by second bit line BL2 612-2 through select transistor 626 of Row R+3 during READ PERIOD 2. Similarly, the buffer transistor 614 of Row R+4 is coupled to generate an output signal 630-4, which is also coupled to be received by second bit line BL2 612-2 through second select transistor 626-2 of Row R+4 during READ PERIOD 2. In one example, the output signal 630 generated by each buffer transistor 624 comprises a current. Therefore, the total output signal 634 for the readout of the right pair of "PD" photodiodes is a sum of the currents received by second bit line BL2 612-2 during READ PERIOD 2 of FIG. 6C.

In various examples, it is appreciated that the transfer transistor control signals coupled to the control the transfer transistors coupled to the left pair of PDAF photodiodes "PD" and the transfer transistor control signals coupled to the control the transfer transistors coupled to the right pair of PDAF photodiodes "PD" are always complements of one another in FIGS. 6B-6C. Therefore, in one example, a single transfer transistor control signal may be generated to control the transfer transistors that are coupled to the PDAF photodiodes "PD". In that example, an inverter is coupled to receive the single transfer transistor control signal. In that example, the transfer transistors coupled to the left pair of PDAF photodiodes "PD" are coupled to receive the single transfer transistor control signal, and the transfer transistors coupled to the right pair of PDAF photodiodes "PD" are coupled to receive the output of the inverter coupled to receive the single transfer transistor control signal. In another similar example, the transfer transistors coupled to the right pair of PDAF photodiodes "PD" are coupled to receive the single transfer transistor control signal, and the transfer transistors coupled to the left pair of PDAF photodiodes "PD" are coupled to receive the output of the inverter coupled to receive the single transfer transistor control signal.

Therefore, it is appreciated that the examples illustrated in FIGS. 6B-6C shown above are capable of also reading out PDAF photodiode "PD" information as well as regular image photodiode information in accordance with the teachings of the present invention. In various examples, it is noted that information from the left pair of PDAF photodiodes may be separated in different spatial locations or in different frames from information from the right pair of PDAF photodiodes.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An imaging device, comprising:
   a plurality of groupings of photodiodes of a photodiode array, wherein each grouping of photodiodes includes four photodiodes that are neighboring in a pixel array;
   a plurality of groupings of transfer transistors, wherein each grouping of transfer transistors is coupled to a respective grouping of photodiodes, wherein each grouping of transfer transistors includes four transfer transistors, wherein each of the four transfer transistors is coupled to a respective one of the four photodiodes of the respective grouping of photodiodes,
   a plurality of floating diffusions, wherein each floating diffusion is coupled to a respective grouping of transfer transistors, wherein said each floating diffusion is selectively coupled to up to two of the four photodiodes of the respective grouping of photodiodes at a time through the respective grouping of transfer transistors;
   a plurality of buffer transistors, wherein each buffer transistor is coupled to a respective floating diffusion of the plurality of floating diffusions, wherein the plurality of buffer transistors comprises a first grouping of buffer transistors and a second grouping of buffer transistors;
   a plurality of bit lines arranged into pairs of bit lines, wherein each pair of bit lines is coupled to a respective single column of groupings of photodiodes in the pixel array, wherein said each pair of bit lines includes:
      a first bit line selectively coupled to up to two buffer transistors of the first grouping of buffer transistors at a time; and
      a second bit line selectively coupled to up to two buffer transistors of the second grouping of buffer transistors at a time; and
   a color filter array including a plurality of groupings of color filters disposed over respective photodiodes of the photodiode array, wherein each grouping of color filters includes four color filters having a same color, wherein each grouping of color filters overlaps two groupings of photodiodes,
   wherein at a time when the first bit line is coupled to two buffer transistors of the first grouping, and the second bit line is coupled to two buffer transistors of the second grouping,
   one of said two buffer transistors of the first grouping and said two buffer transistors of the second grouping are coupled to respective floating diffusions that are each coupled to two respective photodiodes that are both overlapped by color filters having the same color, and
   an other one of said two buffer transistors of the first grouping and said two buffer transistors of the second grouping are coupled to respective floating diffusions that are each coupled to respective photodiodes that are configured as phase detection autofocus (PDAF) photodiodes of the pixel array.

2. The imaging device of claim 1, wherein said two groupings of photodiodes that are overlapped by said grouping of color filters are in a same single column of groupings of photodiodes in the pixel array.

3. The imaging device of claim 1,
   wherein at a time when the first bit line is coupled to two buffer transistors of the first grouping, said two buffer transistors of the first grouping are coupled to neighboring floating diffusions in the pixel array, and
   wherein at a time when the second bit line is coupled to two buffer transistors of the second grouping, said two buffer transistors of the second grouping are coupled to neighboring floating diffusions in the pixel array.

4. The imaging device of claim 1,
   wherein at a time when the first bit line is coupled to two buffer transistors of the first grouping, said two buffer transistors of the first grouping are coupled to respective floating diffusions that are each coupled to two respective photodiodes that are both overlapped by color filters having the same color, and
   wherein at a time when the second bit line is coupled to two buffer transistors of the second grouping, said two buffer transistors of the second grouping are coupled to respective floating diffusions that are each coupled to two respective photodiodes that are both overlapped by color filters having the same color.

5. The imaging device of claim 1, further comprising a plurality of select transistors, wherein the plurality of select transistors comprises a first grouping of select transistors and a second grouping of select transistors,
   wherein each select transistor of the first grouping of select transistors is coupled between a respective buffer transistor of the first grouping of buffer transistors and the first bit line of each pair of bit lines coupled to the respective single column of groupings of photodiodes in the pixel array, and
   wherein each select transistor of the second grouping of select transistors is coupled between a respective buffer transistor of the second grouping of buffer transistors and the second bit line of each pair of bit lines coupled to the respective single column of groupings of photodiodes in the pixel array.

6. The imaging device of claim 5, wherein the plurality of groupings of photodiodes are arranged in a repeating pattern along each column of groupings of photodiodes in the pixel array, wherein the repeating pattern comprises in order:
   N neighboring groupings of photodiodes coupled to respective buffer transistors coupled to the first bit line through respective select transistors of the first grouping of select transistors; and
   N neighboring groupings of photodiodes coupled to respective buffer transistors coupled to the second bit line through respective select transistors of the second grouping of select transistors.

7. The imaging device of claim 5, wherein the plurality of buffer transistors comprises:
   a first subset of buffer transistors included in the first grouping of buffer transistors;

a second subset of buffer transistors included in the second grouping of buffer transistors; and
a third subset of buffer transistors included in both the first grouping of buffer transistors and the second grouping of buffer transistors.

8. The imaging device of claim 7, wherein the plurality of groupings of photodiodes are arranged in a repeating pattern along each column of groupings of photodiodes in the pixel array, wherein the repeating pattern comprises in order:
one grouping of photodiodes coupled to a first respective buffer transistor of the third subset of buffer transistors that is coupled to the first bit line through a first respective select transistor of the first grouping of select transistors and the second bit line through a first respective select transistor of the second grouping of select transistors;
one grouping of photodiodes coupled to a respective buffer transistor of the first subset of buffer transistors that is coupled to the first bit line through a second respective select transistor of the first grouping of select transistors;
one grouping of photodiodes coupled to a second respective buffer transistor of the third subset of buffer transistors that is coupled to the first bit line through a third respective select transistor of the first grouping of select transistors and the second bit line through a second respective select transistor of the second grouping of select transistors; and
one grouping of photodiodes coupled to a respective buffer transistor of the second subset of buffer transistors that is coupled to the second bit line through a third respective select transistor of the second grouping of select transistors.

9. The imaging device of claim 1, wherein each buffer transistor has a gate terminal coupled to the respective floating diffusion to generate an output signal in response to image charge received by the respective floating diffusion from said up to two of the four photodiodes of the respective grouping of photodiodes.

10. The imaging device of claim 9,
wherein the first bit line is selectively coupled to receive a sum of the output signals from said up to two buffer transistors of the first grouping of buffer transistors at a time, and
wherein the second bit line is selectively coupled to receive a sum of the output signals from said up to two buffer transistors of the second grouping of buffer transistors at a time.

11. An imaging system, comprising:
a pixel array coupled to generate image data in response to incident light, the pixel array including:
a plurality of groupings of photodiodes, wherein each grouping of photodiodes includes four photodiodes that are neighboring in the pixel array;
a plurality of groupings of transfer transistors, wherein each grouping of transfer transistors is coupled to a respective grouping of photodiodes, wherein each grouping of transfer transistors includes four transfer transistors, wherein each of the four transfer transistors is coupled to a respective one of the four photodiodes of the respective grouping of photodiodes;
a plurality of floating diffusions, wherein each floating diffusion is coupled to a respective grouping of transfer transistors, wherein said each floating diffusion is selectively coupled to up to two of the four photodiodes of the respective grouping of photodiodes at a time through the respective grouping of transfer transistors;
a plurality of buffer transistors, wherein each buffer transistor is coupled to a respective floating diffusion of the plurality of floating diffusions, wherein the plurality of buffer transistors comprises a first grouping of buffer transistors and a second grouping of buffer transistors;
a plurality of bit lines arranged into pairs of bit lines, wherein each pair of bit lines is coupled to a respective single column of groupings of photodiodes in the pixel array, wherein said each pair of bit lines includes:
a first bit line selectively coupled to up to two buffer transistors of the first grouping of buffer transistors at a time; and
a second bit line selectively coupled to up to two buffer transistors of the second grouping of buffer transistors at a time; and
a color filter array including a plurality of groupings of color filters disposed over respective photodiodes of the photodiode array, wherein each grouping of color filters includes four color filters having a same color, wherein each grouping of color filters overlaps two groupings of photodiodes,
wherein at a time when the first bit line is coupled to two buffer transistors of the first grouping, and the second bit line is coupled to two buffer transistors of the second grouping,
one of said two buffer transistors of the first grouping and said two buffer transistors of the second grouping are coupled to respective floating diffusions that are each coupled to two respective photodiodes that are both overlapped by color filters having the same color, and
an other one of said two buffer transistors of the first grouping and said two buffer transistors of the second grouping are coupled to respective floating diffusions that are each coupled to respective photodiodes that are configured as phase detection autofocus (PDAF) photodiodes of the pixel array;
a control circuitry coupled to the pixel array to control operation of the pixel array; and
a readout circuitry coupled to the pixel array to read out the image data from the pixel array.

12. The imaging system of claim 11, further comprising function logic coupled to the readout circuitry to store the image data read out from the pixel array.

13. The imaging system of claim 11, wherein the readout circuitry is coupled to read out the image data from the pixel array through the plurality of bitlines.

14. The imaging system of claim 11, wherein said two groupings of photodiodes that are overlapped by said grouping of color filters are in a same single column of groupings of photodiodes in the pixel array.

15. The imaging system of claim 11, wherein the plurality of groupings of color filters are arranged in a Bayer pattern.

16. The imaging system of claim 11,
wherein at a time when the first bit line is coupled to two buffer transistors of the first grouping, said two buffer transistors of the first grouping are coupled to neighboring floating diffusions in the pixel array, and
wherein at a time when the second bit line is coupled to two buffer transistors of the second grouping, said two buffer transistors of the second grouping are coupled to neighboring floating diffusions in the pixel array.

17. The imaging system of claim 11,
wherein at a time when the first bit line is coupled to two buffer transistors of the first grouping, said two buffer transistors of the first grouping are coupled to respective floating diffusions that are each coupled to two respective photodiodes that are both overlapped by color filters having the same color, and
wherein at a time when the second bit line is coupled to two buffer transistors of the second grouping, said two buffer transistors of the second grouping are coupled to respective floating diffusions that are each coupled to two respective photodiodes that are both overlapped by color filters having the same color.

18. The imaging system of claim 11, wherein the pixel array further comprises a plurality of select transistors, wherein the plurality of select transistors comprises a first grouping of select transistors and a second grouping of select transistors,
wherein each select transistor of the first grouping of select transistors is coupled between a respective buffer transistor of the first grouping of buffer transistors and the first bit line of each pair of bit lines coupled to the respective single column of groupings of photodiodes in the pixel array, and
wherein each select transistor of the second grouping of select transistors is coupled between a respective buffer transistor of the second grouping of buffer transistors and the second bit line of each pair of bit lines coupled to the respective single column of groupings of photodiodes in the pixel array.

19. The imaging system of claim 18, wherein the plurality of groupings of photodiodes are arranged in a repeating pattern along each column of groupings of photodiodes in the pixel array, wherein the repeating pattern comprises in order:
N neighboring groupings of photodiodes coupled to respective buffer transistors coupled to the first bit line through respective select transistors of the first grouping of select transistors; and
N neighboring groupings of photodiodes coupled to respective buffer transistors coupled to the second bit line through respective select transistors of the second grouping of select transistors.

20. The imaging system of claim 18, wherein the plurality of buffer transistors comprises:
a first subset of buffer transistors included in the first grouping of buffer transistors;
a second subset of buffer transistors included in the second grouping of buffer transistors; and
a third subset of buffer transistors included in both the first grouping of buffer transistors and the second grouping of buffer transistors.

21. The imaging system of claim 20, wherein the plurality of groupings of photodiodes are arranged in a repeating pattern along each column of groupings of photodiodes in the pixel array, wherein the repeating pattern comprises in order:
one grouping of photodiodes coupled to a first respective buffer transistor of the third subset of buffer transistors that is coupled to the first bit line through a first respective select transistor of the first grouping of select transistors and the second bit line through a first respective select transistor of the second grouping of select transistors;
one grouping of photodiodes coupled to a respective buffer transistor of the first subset of buffer transistors that is coupled to the first bit line through a second respective select transistor of the first grouping of select transistors;
one grouping of photodiodes coupled to a second respective buffer transistor of the third subset of buffer transistors that is coupled to the first bit line through a third respective select transistor of the first grouping of select transistors and the second bit line through a second respective select transistor of the second grouping of select transistors; and
one grouping of photodiodes coupled to a respective buffer transistor of the second subset of buffer transistors that is coupled to the second bit line through a third respective select transistor of the second grouping of select transistors.

22. The imaging system of claim 11, wherein each buffer transistor has a gate terminal coupled to the respective floating diffusion to generate an output signal in response to image charge received by the respective floating diffusion from said up to two of the four photodiodes of the respective grouping of photodiodes.

23. The imaging system of claim 22,
wherein the first bit line is selectively coupled to receive a sum of the output signals from said up to two buffer transistors of the first grouping of buffer transistors at a time, and
wherein the second bit line is selectively coupled to receive a sum of the output signals from said up to two buffer transistors of the second grouping of buffer transistors at a time.

* * * * *

UNITED STATES PATENT AND TRADEMARK OFFICE
CERTIFICATE OF CORRECTION

PATENT NO. : 11,284,045 B2  
APPLICATION NO. : 16/855857  
DATED : March 22, 2022  
INVENTOR(S) : Qingfei Chen et al.

Page 1 of 1

It is certified that error appears in the above-identified patent and that said Letters Patent is hereby corrected as shown below:

On the Title Page

Item (73), Column 1, Line 1, delete "Technologies." and insert -- Technologies, -- therefor.

Signed and Sealed this  
Fifth Day of December, 2023

Katherine Kelly Vidal  
*Director of the United States Patent and Trademark Office*